(12) United States Patent
Sugimoto et al.

(10) Patent No.: US 8,778,502 B2
(45) Date of Patent: Jul. 15, 2014

(54) GLASS CERAMIC COMPOSITION, GLASS CERAMIC SINTERED BODY, AND MONOLITHIC CERAMIC ELECTRONIC COMPONENT

(75) Inventors: Yasutaka Sugimoto, Kyoto (JP); Sadaaki Sakamoto, Kouka (JP); Hiroshige Adachi, Omihachiman (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 976 days.

(21) Appl. No.: 12/356,555

(22) Filed: Jan. 21, 2009

(65) Prior Publication Data

US 2009/0122506 A1    May 14, 2009

Related U.S. Application Data

(63) Continuation of application No. PCT/JP2007/065360, filed on Aug. 6, 2007.

(30) Foreign Application Priority Data

Aug. 9, 2006   (JP) .................................. 2006-216664

(51) Int. Cl.
  *B32B 15/04* (2006.01)
  *B23B 17/00* (2006.01)
  *C03C 6/00* (2006.01)

(52) U.S. Cl.
  USPC ........... 428/432; 428/688; 428/697; 428/699; 428/701; 428/702; 501/134; 501/136; 501/154; 501/102; 501/103; 501/108; 501/122; 501/53

(58) Field of Classification Search
  CPC ........ C04B 35/03; C04B 35/14; C04B 35/46; C04B 35/48; C04B 35/49; C03C 3/066; C03C 14/004
  USPC ......... 428/210, 432, 701, 702, 688, 697, 699; 501/134, 136, 154, 102, 103, 108, 122, 501/53
  See application file for complete search history.

(56) References Cited

U.S. PATENT DOCUMENTS 3,809,973 A * 5/1974 Hurley ........................... 361/305
4,223,369 A * 9/1980 Burn ............................ 361/321.4

(Continued)

FOREIGN PATENT DOCUMENTS

JP   H05-052602     8/1993
JP   2001-278664 A  10/2001

(Continued)

OTHER PUBLICATIONS

JPO Office Action (in Appl. Serial No. 2008-528811), mailed Jan. 31, 2012.

(Continued)

*Primary Examiner* — David Sample
*Assistant Examiner* — Lauren Colgan
(74) *Attorney, Agent, or Firm* — Dickstein Shapiro LLP (57) ABSTRACT

A glass ceramic composition includes a $SrZrO_3$ ceramic, a $Li_2O$—$MgO$—$ZnO$—$B_2O_3$—$SiO_2$-based glass, $Mg_2SiO_4$ in an amount of about 5 to 40 weight percent, and a $SrTiO_3$ ceramic in an amount in the range of about 0 to about 6 weight percent of the total. The $Li_2O$—$MgO$—$ZnO$—$B_2O_3$—$SiO_2$-based glass accounts for about 1 to about 12 weight percent of the total.

6 Claims, 4 Drawing Sheets

(56) References Cited

U.S. PATENT DOCUMENTS

| | | | |
|---|---|---|---|
| 4,293,838 A * | 10/1981 | Wahlers et al. | 338/308 |
| 4,593,006 A * | 6/1986 | Takabatake et al. | 501/32 |
| 5,204,301 A * | 4/1993 | Ohkubo et al. | 501/136 |
| 5,990,029 A * | 11/1999 | Satoh et al. | 501/138 |
| 6,108,192 A * | 8/2000 | Sugimoto et al. | 361/321.1 |
| 6,335,301 B1 * | 1/2002 | Kikuchi et al. | 501/136 |
| 6,385,035 B1 * | 5/2002 | Matoba et al. | 361/321.1 |
| 6,429,163 B2 * | 8/2002 | Kim et al. | 501/137 |
| 6,730,624 B2 * | 5/2004 | Motoki et al. | 501/136 |
| 7,351,674 B2 * | 4/2008 | Mori et al. | 501/32 |
| 7,439,202 B2 * | 10/2008 | Mori et al. | 501/134 |
| 8,097,350 B2 | 1/2012 | Sugimoto et al. | |
| 2003/0073565 A1 * | 4/2003 | Ellis et al. | 501/32 |
| 2006/0287184 A1 * | 12/2006 | Mori et al. | 501/32 |
| 2007/0128450 A1 * | 6/2007 | Mori et al. | 428/432 |
| 2007/0237935 A1 * | 10/2007 | Mori et al. | 428/210 |
| 2010/0046137 A1 * | 2/2010 | Adachi | 361/301.4 |
| 2011/0223399 A1 * | 9/2011 | Adachi et al. | 428/212 |

FOREIGN PATENT DOCUMENTS

| | | | |
|---|---|---|---|
| JP | 2005-104775 A | | 4/2005 |
| JP | 2006-181737 A | | 7/2006 |
| WO | WO-2005-082806 | * | 2/2005 |
| WO | WO-2008-018407 A1 | | 2/2008 |

OTHER PUBLICATIONS

Official Communication issued in International Patent Application No. PCT/JP2007/065360, mailed on Sep. 18, 2007.

* cited by examiner

GLASS CERAMIC COMPOSITION, GLASS CERAMIC SINTERED BODY, AND MONOLITHIC CERAMIC ELECTRONIC COMPONENT

BACKGROUND OF THE INVENTION

1. Field of the Invention

The present invention relates to a glass ceramic composition, a glass ceramic sintered body produced by firing the glass ceramic composition, and a monolithic ceramic electronic component including glass ceramic layers produced by firing the glass ceramic composition. In particular, the present invention relates to an improvement for increasing the Q value of a glass ceramic sintered body.

2. Description of the Related Art

An example of a glass ceramic composition of the related art is a ceramic composition described in Japanese Unexamined Patent Application Publication No. 5-217426. Japanese Unexamined Patent Application Publication No. 5-217426 discloses a non-reducing dielectric glass ceramic composition in which a $Li_2O$—RO—$B_2O_3$—$SiO_2$-based glass (wherein R is at least one type of element selected from Ba, Ca, and Sr) is added to a (Ca, Sr) (Zr, Ti)$O_3$—MnO—$SiO_2$ ceramic used as a main component.

The glass ceramic composition can be fired at a temperature of about 1,000° C. or lower. As a result of the firing, a glass ceramic sintered body having a high relative dielectric constant, a characteristic that the dielectric constant is stable with respect to temperature, and a high Q value can be obtained. Accordingly, when the glass ceramic composition described in Japanese Unexamined Patent Application Publication No. 5-217426 is used, a metal having a high electrical conductivity, e.g., gold, silver, or copper, can be used in conductor patterns formed inside the glass ceramic sintered body, and thus, a loss due to the resistance of the conductor can be reduced in a radio-frequency range. Therefore, for example, when the glass ceramic composition is used as a monolithic ceramic electronic component defining a resonator, a filter, a capacitor, or other electronic component, excellent radio-frequency characteristics can be achieved.

However, although the glass ceramic composition described in Japanese Unexamined Patent Application Publication No. 5-217426 has excellent characteristics as described above, there is room for further improvement. In particular, a Q value, Qf, of about 5,000 GHz is the limit according to Japanese Unexamined Patent Application Publication No. 5-217426.

SUMMARY OF THE INVENTION

To overcome the problems described above, preferred embodiments of the present invention provide a glass ceramic composition that can further improve the characteristics, in particular the Q value, of the glass ceramic composition described in Japanese Unexamined Patent Application Publication No. 5-217426, a glass ceramic sintered body produced by firing the above glass ceramic composition, and a monolithic ceramic electronic component including glass ceramic layers produced by firing the glass ceramic composition.

A glass ceramic composition according to a preferred embodiment of the present invention includes a $SrZrO_3$ ceramic and a $Li_2O$—MgO—ZnO—$B_2O_3$—$SiO_2$-based glass, wherein the $Li_2O$—MgO—ZnO—$B_2O_3$—$SiO_2$-based glass accounts for about 1 to about 12 weight percent of the total and includes $Li_2O$ in an amount in the range of about 3.5 to about 15 weight percent, MgO in an amount in the range of about 20 to about 50 weight percent, BaO in an amount in the range of about 0 to about 25 weight percent, CaO in an amount in the range of about 0 to about 10 weight percent, SrO in an amount in the range of about 0 to about 25 weight percent, $B_2O_3$ in an amount in the range of about 16 to about 29 weight percent, $SiO_2$ in an amount in the range of about 11 to about 35 weight percent, ZnO in an amount in the range of about 5 to about 20 weight percent, and $Al_2O_3$ in an amount in the range of about 0 to about 15 weight percent, and the glass ceramic composition further includes a $SrTiO_3$ ceramic in an amount in the range of about 0 to about 6 weight percent of the total.

Preferably, the glass ceramic composition further includes a $BaZrO_3$ ceramic in an amount in the range of about 1 to about 84 weight percent. The content of the $BaZrO_3$ ceramic is more preferably in the range of about 1 to about 30 weight percent.

In addition, preferably, the glass ceramic composition according to a preferred embodiment of the present invention further includes $Mg_2SiO_4$ in an amount of about 40 weight percent or less.

Preferably, the glass ceramic composition according to a preferred embodiment of the present invention further includes $TiO_2$ in an amount in the range of about 3 to about 10 weight percent.

Preferably, the glass ceramic composition according to a preferred embodiment of the present invention further includes $ZrO_2$ in an amount of about 6 weight percent or less.

In addition, preferred embodiments of the present invention provide a glass ceramic sintered body produced by firing the above-described glass ceramic composition.

Other preferred embodiments of the present invention provide a monolithic ceramic electronic component including a first glass ceramic layer produced by firing the above-described glass ceramic composition.

When the monolithic ceramic electronic component according to preferred embodiments the present invention includes a second glass ceramic layer laminated with the first glass ceramic layer, it is preferable that the second glass ceramic layer be obtained by firing a second glass ceramic composition having a composition described below.

Specifically, the second glass ceramic composition preferably includes (1) a first ceramic powder including forsterite as a main component, (2) a second ceramic powder composed of at least one material selected from the group consisting of a ceramic powder including calcium titanate as a main component, a ceramic powder including strontium titanate as a main component, and a ceramic powder including titanium oxide as a main component, and (3) a borosilicate glass powder including lithium in an amount in the range of about 3 to about 15 weight percent in the form of $Li_2O$, magnesium in an amount in the range of about 20 to about 50 weight percent in the form of MgO, boron in an amount in the range of about 15 to about 30 weight percent in the form of $B_2O_3$, silicon in an amount in the range of about 10 to about 45 weight percent in the form of $SiO_2$, zinc in an amount in the range of about 6 to about 20 weight percent in the form of ZnO, and aluminum in an amount in the range of about 0 to about 15 weight percent in the form of $Al_2O_3$.

In the second glass ceramic composition, the borosilicate glass powder preferably accounts for at least about 3 weight percent of the second glass ceramic composition.

In addition, at least one type of additive component selected from the group consisting of calcium oxide, barium oxide, and strontium oxide is preferably added to the borosilicate glass powder.

When the content of the additive component is represented by the ratio of the additive component to the borosilicate glass powder, the lower limit of the content of the additive component is about 2 weight percent in total when calcium oxide, barium oxide, and strontium oxide are in the form of CaO, BaO, and SrO, respectively, and the upper limit of the content of the additive component is about 15 weight percent in the form of CaO when calcium oxide is added, about 25 weight percent in the form of BaO when barium oxide is added, and about 25 weight percent in the form of SrO when strontium oxide is added.

Preferably, the monolithic ceramic electronic component according to preferred embodiments of the present invention further includes conductor patterns including gold, silver, or copper as a main component, the conductor patterns being provided on a surface of and/or inside the monolithic ceramic electronic component by simultaneous firing with the glass ceramic composition.

According to the glass ceramic composition of preferred embodiments of the present invention, a $Li_2O$—$MgO$—$ZnO$—$B_2O_3$—$SiO_2$-based glass having a specific composition ratio exhibits a very good wettability to a $SrZrO_3$ ceramic. Accordingly, by adding the $Li_2O$—$MgO$—$ZnO$—$B_2O_3$—$SiO_2$-based glass even in a relatively small amount, low-temperature sintering can be satisfactorily achieved while maintaining characteristics of the $SrZrO_3$ ceramic, as compared to the $Li_2O$—$RO$—$B_2O_3$—$SiO_2$-based glass described in Japanese Unexamined Patent Application Publication No. 5-217426. Consequently, with a glass ceramic sintered body obtained by firing this glass ceramic composition, a high relative dielectric constant of the $SrZrO_3$ ceramic can be maintained.

In addition, the glass ceramic composition according to preferred embodiments of the present invention precipitates a crystal phase of $Mg_3B_2O_6$, $Li_2MgSi_2O_8$, for example. Such a crystal phase exhibits a high Q value. Therefore, with the glass ceramic composition according to preferred embodiments of the present invention, a high Q value can be obtained.

When the glass ceramic composition further includes a $SrTiO_3$ ceramic, by controlling the content of the $SrTiO_3$ ceramic to be about 6 weight percent or less of the total, the Q value can be further improved without increasing the temperature coefficient of dielectric constant in the negative direction.

Therefore, with a monolithic ceramic electronic component including a glass ceramic layer produced by firing the glass ceramic composition according to a preferred embodiment of the present invention, good radio-frequency characteristics can be achieved.

The glass ceramic composition according to a preferred embodiment of the present invention can be sintered at a low temperature of about 1,000° C. or lower. Accordingly, conductor patterns including gold, silver, or copper as a main component and formed by simultaneous firing with the glass ceramic composition can be provided on a surface of and/or inside the monolithic ceramic electronic component. By providing the conductor patterns including gold, silver, or copper as a main component, a loss due to the resistance of the conductor patterns can be reduced.

When the glass ceramic composition according to a preferred embodiment of the present invention further includes a $BaZrO_3$ ceramic in an amount in the range of about 1 to about 84 weight percent, a rate of change in capacitance of a glass ceramic sintered body produced by firing the glass ceramic composition before and after a load test can be reduced. Furthermore, when the content of the $BaZrO_3$ ceramic is limited to the range of about 1 to about 30 weigh percent, the rate of change in capacitance can be further reduced.

When the glass ceramic composition according to a preferred embodiment of the present invention further includes in an amount of about 40 weight percent or less, the Q value can be further improved.

When the glass ceramic composition according to a preferred embodiment of the present invention further includes $TiO_2$ in an amount in the range of about 3 to about 10 weight percent, the temperature coefficient of dielectric constant can be further stabilized.

When the glass ceramic composition according to a preferred embodiment of the present invention further includes $ZrO_2$ in an amount of about 6 weight percent or less, a higher Q value can be obtained.

When a monolithic ceramic electronic component according to a preferred embodiment of the present invention includes the above-mentioned second glass ceramic layer laminated with a first glass ceramic layer obtained by firing the glass ceramic composition according to a preferred embodiment of the present invention, the second glass ceramic layer has good chemical stability, a relatively low relative dielectric constant, a high Q value, and a stable temperature coefficient ($\tau_f$) of resonant frequency.

In addition, the second glass ceramic layer has good compatibility with the first glass ceramic layer. Accordingly, a monolithic ceramic electronic component having high reliability can be obtained.

The second glass ceramic composition to be formed into the second glass ceramic layer preferably includes the first ceramic powder in an amount of at least about 55 weight percent, the second ceramic powder in an amount in the range of about 6 to about 30 weight percent, and the borosilicate glass powder in an amount in the range of about 3 to about 20 weight percent. In this second glass ceramic composition, even when the content of the borosilicate glass powder is relatively small, for example, about 20 weight percent or less, the excellent characteristics can be obtained as described above. Consequently, the second glass ceramic composition is advantageous in terms of cost. According to the second glass ceramic composition, a reaction between the second ceramic powder and the glass is easily controlled, the temperature coefficient ($\tau_f$) of resonant frequency is easily controlled by adding additives, and a monolithic ceramic electronic component having good plating resistance can be obtained.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
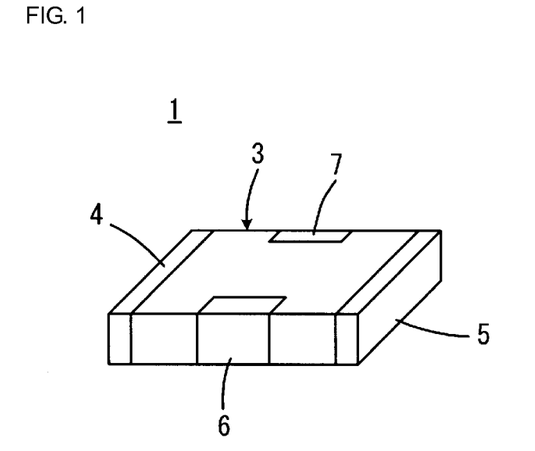
FIG. 1 is a perspective view showing an LC filter which is an example of a monolithic ceramic electronic component defined by a glass ceramic composition according to a preferred embodiment of the present invention.
Figure 2:
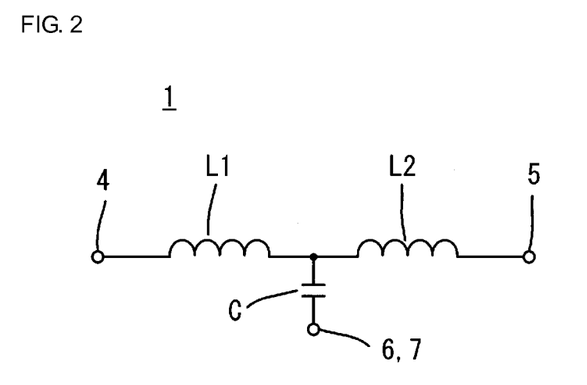
FIG. 2 is an equivalent circuit diagram provided by the LC filter shown in FIG. 1.
Figure 3:
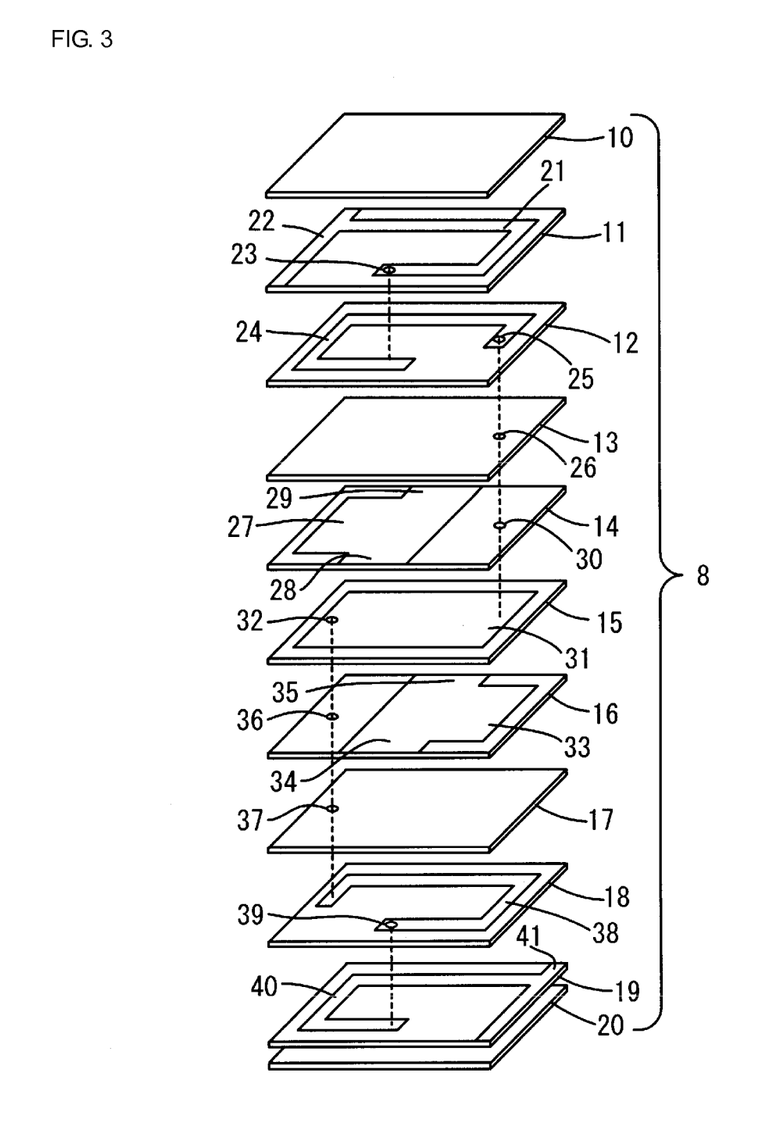
FIG. 3 is an exploded perspective view of a green laminated structure which is an intermediate product to be subjected to a firing step in producing the filter shown in FIG. 1.

FIGS. 1 to 3 illustrate an LC filter which is an example of a monolithic ceramic electronic component defined by a glass ceramic composition according to various preferred embodiments of the present invention. Here, FIG. 1 is a perspective view showing an LC filter 1, FIG. 2 is an equivalent circuit diagram provided by the LC filter 1, and FIG. 3 is an exploded perspective view of a green laminated structure 8 which is an intermediate product to be subjected to a firing step in producing the LC filter 1.

As shown in FIG. 1, the LC filter 1 includes a component body 3 which is a laminated structure including a plurality of laminated glass ceramic layers. Terminal electrodes 4 and 5 are provided on outer surfaces of ends of the component body 3, and terminal electrodes 6 and 7 are provided on intermediate portions of side surfaces thereof.

As shown in FIG. 2, the LC filter 1 includes two inductance elements L1 and L2 that are connected in series between the terminal electrodes 4 and 5 and a capacitance element C between a connection point of the inductance elements L1 and L2 and the terminal electrodes 6 and 7.

Referring to FIG. 3, a green laminated structure 8 to be formed into the component body 3 includes a plurality of green glass ceramic layers 10 to 20. The number of green glass ceramic layers is not limited to the number shown in the figure, and may be any suitable number.

Each of the green glass ceramic layers 10 to 20 is made of a green sheet obtained by forming a slurry including a glass ceramic composition of a preferred embodiment of the present invention having a composition described below by, for example, a doctor blade method.

Furthermore, to provide the inductance elements L1 and L2 and the capacitance element C shown in FIG. 2, conductor patterns are provided on some of the green glass ceramic layers 10 to 20 so as to have the following arrangement.

On a green glass ceramic layer 11, a coil pattern 21 defining a portion of the inductance element L1 and a lead pattern 22 extending from an end of the coil pattern 21 are provided. A via hole conductor 23 is provided at another end of the coil pattern 21.

On a green glass ceramic layer 12, a coil pattern 24 defining a portion of the inductance element L1 is provided, and a via hole conductor 25 is provided at an end of the coil pattern 24. Another end of the coil pattern 24 is connected to the via hole conductor 23.

On a green glass ceramic layer 13, a via hole conductor 26 connected to the via hole conductor 25 is provided.

On a green glass ceramic layer 14, a capacitor pattern 27 defining a portion of the capacitance element C, and lead patterns 28 and 29 extending from the capacitor pattern 27 are provided. A via hole conductor 30 connected to the via hole conductor 26 is provided in the green glass ceramic layer 14.

On a green glass ceramic layer 15, a capacitor pattern 31 defining a portion of the capacitance element C, and a via hole conductor 32 connected to the capacitor pattern 31 are provided. The capacitor pattern 31 is connected to the via hole conductor 30.

On a green glass ceramic layer 16, a capacitor pattern 33 defining a portion of the capacitance element C, and lead patterns 34 and 35 extending from the capacitor pattern 33 are provided. A via hole conductor 36 connected to the via hole conductor 32 is provided in the green glass ceramic layer 16.

On a green glass ceramic layer 17, a via hole conductor 37 connected to the via hole conductor 36 is provided.

On a green glass ceramic layer 18, a coil pattern 38 defining a portion of the inductance element L2 is provided, and a via hole conductor 39 is provided at an end of the coil pattern 38. Another end of the coil pattern 38 is connected to the via hole conductor 37.

On a green glass ceramic layer 19, a coil pattern 40 defining a portion of the inductance element L2, and a lead pattern 41 extending from an end of the coil pattern 40 are provided. Another end of the coil pattern 40 is connected to the via hole conductor 39.

In forming the coil patterns 21, 24, 38, and 40, the lead patterns 22, 28, 29, 34, 35, and 41, the via hole conductors 23, 25, 26, 30, 32, 36, 37, and 39, and the capacitor patterns 27, 31, and 33, a conductive paste including, as a conductive component, a metal powder including, as a main component, gold, silver, or copper is preferably used.

To form the coil patterns 21, 24, 38, and 40, the lead patterns 22, 28, 29, 34, 35, and 41, and the capacitor patterns 27, 31, and 33, a printing method, for example, screen printing is preferably used.

To form the via hole conductors 23, 25, 26, 30, 36, 37, and 39, a through-hole is formed in each of the green sheets to be formed into the related green glass ceramic layers 11 to 18 by punching or other suitable method, and the through-hole is filled with a conductive paste.

To obtain the green laminated structure 8, a plurality of ceramic green sheets to be formed into the green glass ceramic layers 10 to 20 are laminated, and pressed in the lamination direction.

Subsequently, the green laminated structure 8 is fired. In this manner, the component body 3 is produced by firing the green laminated structure 8.

During firing of the green laminated structure 8, a shrinkage-suppressing layer including an inorganic material powder such as an alumina, zirconia, mullite, spinel, or magnesia powder, for example, which does not sinter at a sintering temperature of the ceramic material included in the green glass ceramic layers 10 to 20, may preferably be provided in advance on at least one main surface of the green laminated structure 8, the firing step may be performed in this state, and the shrinkage-suppressing layer may be removed after the firing step. According to this method, shrinkage of the glass ceramic layers 10 to 20 is suppressed in the main-surface direction during the firing step, and thus the dimensional accuracy of the prepared component body 3 can be increased.

Next, for example, a step of applying a conductive paste to the outer surfaces of the component body 3 and a step of baking are performed, thereby forming the terminal electrodes 4 to 7. A plating process may be performed on the terminal electrodes 4 to 7, as required.

The above-mentioned terminal electrode 4 is electrically connected to the lead pattern 22 shown in FIG. 3. The terminal electrode 5 is electrically connected to the lead pattern 41. The terminal electrode 6 is electrically connected to the lead patterns 28 and 34. The terminal electrode 7 is electrically connected to the lead patterns 29 and 35.

Figure 4:
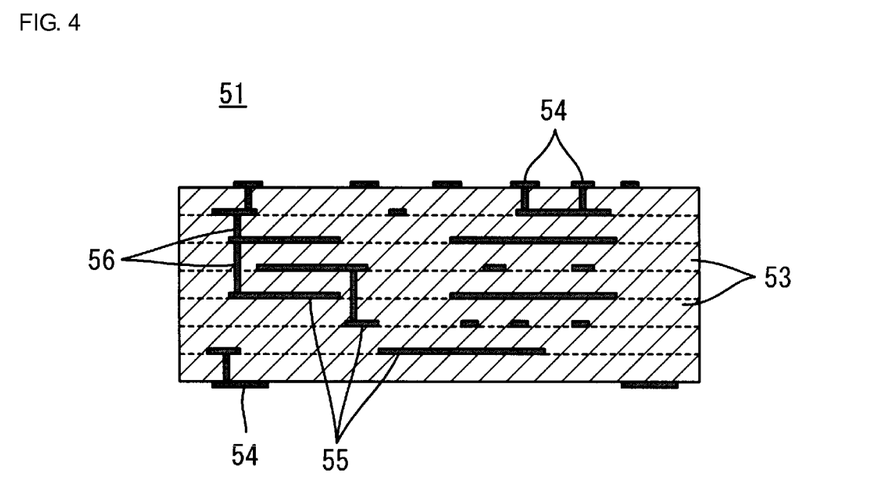
FIG. 4 is a cross-sectional view illustrating a multilayer ceramic substrate which is another example of a monolithic ceramic electronic component defined by a glass ceramic composition according to a preferred embodiment of the present invention.
Figure 5:
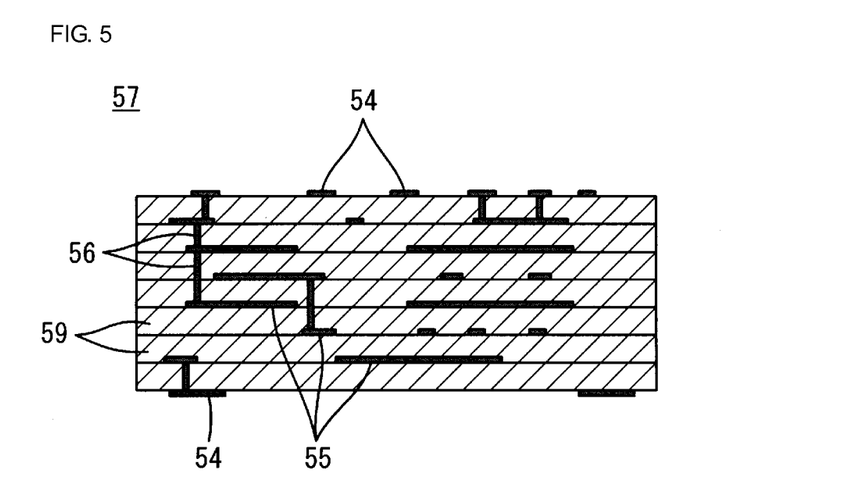
FIG. 5 is a cross-sectional view illustrating a green laminated structure which is an intermediate product to be subjected to a firing step in producing the multilayer ceramic substrate shown in FIG. 4.

FIGS. 4 and 5 illustrate a multilayer ceramic substrate which is another example of a monolithic ceramic electronic component defined by a glass ceramic composition according to a preferred embodiment of the present invention. Here, FIG. 4 is a cross-sectional view illustrating a multilayer ceramic substrate 51, and FIG. 5 is a cross-sectional view illustrating a green laminated structure 57 which is an intermediate product to be subjected to a firing step in producing the multilayer ceramic substrate 51 shown in FIG. 4.

As shown in FIG. 4, the multilayer ceramic substrate 51 includes a plurality of laminated glass ceramic layers 53, and various conductor patterns are provided on some of the glass ceramic layers 53.

The above-mentioned conductor patterns include outer conductor films 54 provided on end surfaces of the lamination direction of the multilayer ceramic substrate 51, inner conductor films 55 provided along interfaces between the glass ceramic layers 53, and via hole conductors 56 provided so as to penetrate through the glass ceramic layers 53.

The outer conductor films 54 are used to be connected to an electronic component (not shown) to be disposed on an outer surface of the multilayer ceramic substrate 51 or used to be connected to a circuit board (not shown) on which the multilayer ceramic substrate 51 is mounted.

The inner conductor films 55 and the via hole conductors 56 function so that passive elements such as a capacitor and an inductor are formed or so that the passive elements are connected to each other.

The multilayer ceramic substrate 51 shown in FIG. 4 is obtained by firing the green laminated structure 57 shown in FIG. 5.

The green laminated structure 57 includes a plurality of laminated green glass ceramic layers 59 to be formed into the glass ceramic layers 53, the outer conductor films 54, the inner conductor films 55, and the via hole conductors 56 described above.

Each of the green glass ceramic layers 59 is made of a green sheet obtained by forming a slurry including a glass ceramic composition according to a preferred embodiment of the present invention having a composition described below by, for example, a doctor blade method.

The methods of forming the outer conductor films 54, the inner conductor films 55, and the via hole conductors 56 are substantially the same as the above-described methods for forming the coil patterns 21 and the via hole conductors 23 shown in FIG. 3.

After the green laminated structure 57 is prepared, the green laminated structure 57 is fired in substantially the same manner as in the case of the LC filter 1 described with reference to FIGS. 1 to 3, thereby obtaining the desired multilayer ceramic substrate 51.

The shrinkage-suppressing layer may preferably be provided during the firing of the green laminated structure 57.

When producing the LC filter 1 or the multilayer ceramic substrate 51 described above, a glass ceramic composition according to a preferred embodiment of the present invention is used as the glass ceramic composition included in the green glass ceramic layers 10 to 20 or 59. More specifically, the glass ceramic composition used includes a $SrZrO_3$ ceramic and a $Li_2O$—$MgO$—$ZnO$—$B_2O_3$—$SiO_2$-based glass, wherein the $Li_2O$—$MgO$—$ZnO$—$B_2O_3$—$SiO_2$-based glass accounts for about 1 to about 12 weight percent of the total and includes $Li_2O$ in an amount in the range of about 3.5 to about 15 weight percent, MgO in an amount in the range of about 20 to about 50 weight percent, BaO in an amount in the range of about 0 to about 25 weight percent, CaO in an amount in the range of about 0 to about 10 weight percent, SrO in an amount in the range of about 0 to about 25 weight percent, $B_2O_3$ in an amount in the range of about 16 to about 29 weight percent, $SiO_2$ in an amount in the range of about 11 to about 35 weight percent, ZnO in an amount in the range of about 5 to about 20 weight percent, and $Al_2O_3$ in an amount in the range of about 0 to about 15 weight percent, and when the glass ceramic composition further includes a $SrTiO_3$ ceramic, the content thereof is about 6 weight percent or less of the total.

As the $SrZrO_3$ ceramic, a ceramic in which the ratio of Sr to Zr is preferably about 1:1 (stoichiometric ratio) preferably is primarily used. Alternatively, for example, the ceramic may preferably be a ceramic represented by $SrZr_xO_{1+2x}$ (wherein x=about 0.95 to about 1.05). Alternatively, some Sr or Zr may preferably be replaced with another element. For example, some Sr may be replaced with Ba or Ca, or some Zr may be replaced with Ti.

In addition, this also applies to the $SrTiO_3$ ceramic. A ceramic in which the ratio of Sr to Ti is preferably about 1:1 (stoichiometric ratio) is primarily used. Alternatively, for example, the ceramic may be a ceramic represented by $SrTi_xO_{1+2x}$ (wherein x=about 0.95 to about 1.05). Alternatively, some Sr or Ti may preferably be replaced with another element. For example, some Sr may be replaced with Ba or Ca, or some Ti may be replaced with Zr.

Preferably, the glass ceramic composition according to a preferred embodiment of the present invention further includes a $BaZrO_3$ ceramic in an amount in the range of about 1 to about 84 weight percent. The content of the $BaZrO_3$ ceramic is more preferably in the range of about 1 to about 30 weight percent.

In addition, preferably, the glass ceramic composition according to a preferred embodiment of the present invention further includes $Mg_2SiO_4$ in an amount of about 40 weight percent or less.

Preferably, the glass ceramic composition according to a preferred embodiment of the present invention further includes $TiO_2$ in an amount in the range of about 3 to about 10 weight percent.

Preferably, the glass ceramic composition according to a preferred embodiment of the present invention further includes $ZrO_2$ in an amount of about 6 weight percent or less. It is believed that $ZrO_2$ contributes to a higher Q value for the following reason. That is, $SrZrO_3$ and $BaZrO_3$ react with added glass, and some $SrZrO_3$ and $BaZrO_3$ are decomposed. Consequently, the Q value may be decreased. As a result of this decomposition, $ZrO_2$, SrO, and BaO are produced. However, the decomposition reaction does not readily occur when $ZrO_2$ is added in advance. Therefore, an original high Q value can be maintained by adding $ZrO_2$.

The glass ceramic composition described above is preferably used as the green glass ceramic layers 10 to 20 or 59. In this case, during firing the green laminated structure 8 or 57, even when a component including gold, silver, or copper, which has a low specific resistance, as a main component is used as a conductive component included in the conductor patterns 21 to 41 or 54 to 56, the glass ceramic layers 10 to 20 or 59 can be sintered by firing at a temperature less than the melting point of the conductive component.

Furthermore, the glass ceramic sintered body portion of the component body 3 or the glass ceramic sintered body of the glass ceramic layers 53 of the multilayer ceramic substrate 51, which are obtained by sintering the green glass ceramic layers 10 to 20 or 59 can have a high relative dielectric constant, good temperature stability, a high Q value, and good insulation reliability in a radio-frequency range.

Figure 6:
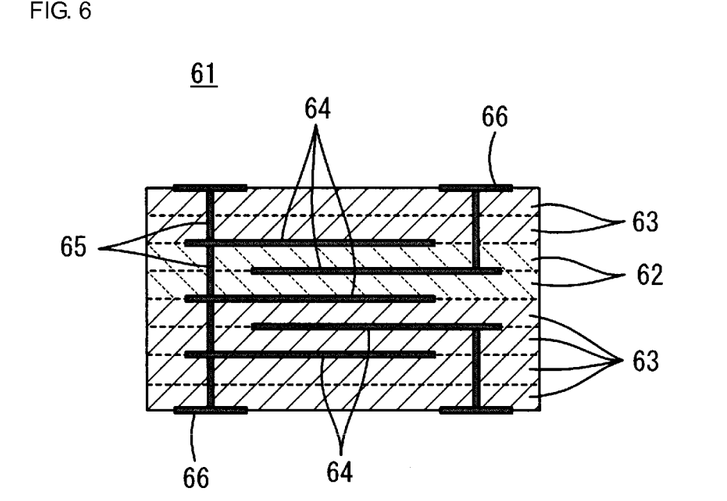
FIG. 6 is a cross-sectional view illustrating a multilayer ceramic substrate which is another example of a monolithic ceramic electronic component defined by a glass ceramic composition according to a preferred embodiment of the present invention.
Figure 7:
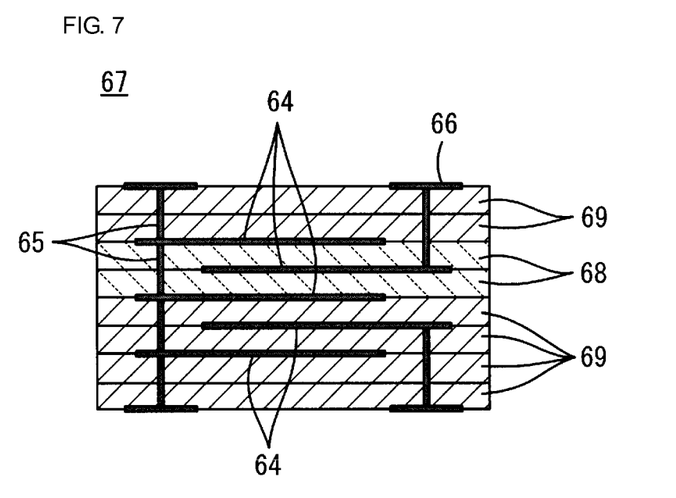
FIG. 7 is a cross-sectional view illustrating a green composite laminated structure which is an intermediate product to be subjected to a firing step in producing the multilayer ceramic substrate shown in FIG. 6.

FIGS. 6 and 7 illustrate a multilayer ceramic substrate which is another example of a monolithic ceramic electronic component constituted by a glass ceramic composition according to a preferred embodiment of the present invention. Here, FIG. 6 is a cross-sectional view illustrating a multilayer ceramic substrate 61, and FIG. 7 is a cross-sectional view illustrating a green composite laminated structure 67 which is an intermediate product to be subjected to a firing step in producing the multilayer ceramic substrate 61 shown in FIG. 6.

The multilayer ceramic substrate 61 includes a plurality of laminated first glass ceramic layers 62 and a plurality of laminated second glass ceramic layers 63. The second glass ceramic layers 63 are disposed so as to sandwich the first glass ceramic layers 62.

The first glass ceramic layers 62 are made of a glass ceramic sintered body obtained by firing a glass ceramic composition according to a preferred embodiment of the present invention, and preferably have a relatively high relative dielectric constant of, for example, at least about 15.

On the other hand, the second glass ceramic layers 63 are made of a glass ceramic sintered body obtained by firing a second glass ceramic composition described below, and preferably have a relatively low relative dielectric constant of, for example, about 10 or less.

The second glass ceramic composition includes (1) a first ceramic powder including forsterite as a main component; (2) a second ceramic powder made of at least one selected from the group consisting of a ceramic powder including calcium titanate as a main component, a ceramic powder including strontium titanate as a main component, and a ceramic powder including titanium oxide as a main component; and (3) a borosilicate glass powder including lithium in an amount in the range of about 3 to about 15 weight percent in the form of $Li_2O$, magnesium in an amount in the range of about 20 to about 50 weight percent in the form of MgO, boron in an amount in the range of about 15 to about 30 weight percent in the form of $B_2O_3$, silicon in an amount in the range of about 10 to about 45 weight percent in the form of $SiO_2$, zinc in an amount in the range of about 6 to about 20 weight percent in the form of ZnO, and aluminum in an amount in the range of about 0 to about 15 weight percent in the form of $Al_2O_3$.

In the second glass ceramic composition, the borosilicate glass powder accounts for at least about 3 weight percent of the second glass ceramic composition. At least one type of additive component selected from the group consisting of calcium oxide, barium oxide, and strontium oxide is added to the borosilicate glass powder. When the content of the additive component is represented by the ratio of the additive component to the borosilicate glass powder, the lower limit of the content of the additive component is about 2 weight percent in total when calcium oxide, barium oxide, and strontium oxide are in the form of CaO, BaO, and SrO, respectively, and the upper limit of the content of the additive component is about 15 weight percent in the form of CaO when calcium oxide is added, about 25 weight percent in the form of BaO when barium oxide is added, and about 25 weight percent in the form of SrO when strontium oxide is added.

The multilayer ceramic substrate 61 includes various conductor patterns. The conductor patterns typically include inner conductor films 64 provided along specific interfaces between the glass ceramic layers 62, between the glass ceramic layers 63, and between the glass ceramic layers 62 and 63; via hole conductors 65 extending so as to penetrate through specific glass ceramic layers 62 and 63; and outer conductor films 66 provided on outer surfaces of the multilayer ceramic substrate 61.

Among the above-mentioned inner conductor films 64, some of the inner conductor films 64 provided so as to be in contact with the first glass ceramic layers 62, which have a relatively high relative dielectric constant, are disposed so as to provide an electrostatic capacitance, thereby defining a capacitor element. The outer conductor films 66 are used for connecting to an electronic component (not shown) to be disposed on an outer surface of the multilayer ceramic substrate 61 or for connecting to a circuit board (not shown) on which the multilayer ceramic substrate 61 is mounted.

The multilayer ceramic substrate 61 shown in FIG. 6 is obtained by firing the green composite laminated structure 67 shown in FIG. 7.

The green composite laminated structure 67 includes a plurality of laminated first green glass ceramic layers 68 to be formed into the first glass ceramic layers 62, a plurality of laminated second green glass ceramic layers 69 to be formed into the second glass ceramic layers 63, the outer conductor films 66, the inner conductor films 64, and the via hole conductors 65.

Each of the first green glass ceramic layers 68 is made of a green sheet obtained by forming a slurry including a glass ceramic composition according to a preferred embodiment of the present invention by, for example, a doctor blade method. On the other hand, each of the second green glass ceramic layers 69 is made of a green sheet obtained by forming a slurry including the second glass ceramic composition by, for example, a doctor blade method.

The methods of forming the outer conductor films 66, the inner conductor films 64, and the via hole conductors 65 are substantially the same as the above-described methods for forming the coil patterns 21 and the via hole conductors 23 shown in FIG. 3.

After the green composite laminated structure 67 is prepared, the green composite laminated structure 67 is fired in substantially the same manner as the LC filter 1 described with reference to FIGS. 1 to 3, thereby obtaining the desired multilayer ceramic substrate 61.

The above-described shrinkage-suppressing layer may preferably be provided also in the firing of the green composite laminated structure 67.

Next, examples of an experiment performed in order to verify the advantages of preferred embodiments of the present invention will be described.

EXPERIMENTAL EXAMPLE 1

First, each of carbonate or oxide powders was weighed such that the composition ratios of $Li_2O$, MgO, BaO, CaO, SrO, $B_2O_3$, $SiO_2$, ZnO, and $Al_2O_3$ shown in Table 1 were satisfied. The powders were sufficiently mixed and then melted at a temperature in the range of about 1,100° C. to about 1,400° C. The resulting product was quenched by being immersed in water. The product was then ground by a wet process to prepare Glass powders G1 to G30.

TABLE 1

| Glass sample No. | Li$_2$O (wt %) | MgO (wt %) | BaO (wt %) | CaO (wt %) | SrO (wt %) | B$_2$O$_3$ (wt %) | SiO$_2$ (wt %) | ZnO (wt %) | Al$_2$O$_3$ (wt %) | Remarks |
|---|---|---|---|---|---|---|---|---|---|---|
| G1* | 2 | 33 | 3 | — | 2 | 25 | 27 | 8 | — | |
| G2 | 3.5 | 33 | 2 | 1 | 2 | 25 | 25.5 | 8 | — | |
| G3 | 15 | 23 | 2 | — | 7 | 20 | 23 | 10 | — | |
| G4* | 16.5 | 25 | 7 | — | — | 20 | 21.5 | 10 | 13 | |
| G5* | 6 | 18 | 5 | — | 5 | 26 | 28 | 8 | 4 | |
| G6 | 6 | 20 | 2 | 2 | 3 | 26 | 29 | 8 | 4 | |
| G7 | 5 | 50 | 4 | — | — | 19 | 16 | 6 | — | |
| G8* | 5 | 52 | 4 | — | — | 18 | 15 | 6 | — | Devitrified |
| G9* | 8 | 34 | 3 | 1 | 6 | 14 | 25 | 7 | 2 | Devitrified |
| G10 | 8 | 34 | 3 | 2 | 3 | 16 | 25 | 7 | 2 | |
| G11 | 6 | 24 | 3 | 1 | 6 | 29 | 21 | 10 | — | |
| G12* | 6 | 23 | 3 | 1 | 6 | 31 | 20 | 10 | — | |
| G13* | 10 | 33 | 3 | 2 | 5 | 23 | 9 | 10 | 5 | Devitrified |
| G14 | 10 | 38 | 3 | — | — | 23 | 11 | 10 | 5 | |
| G15 | 5 | 25 | 5 | — | 7 | 18 | 35 | 5 | — | |
| G16* | 6 | 33 | 4 | — | — | 15 | 36 | 6 | — | |
| G17* | 6 | 25 | 3 | — | 3 | 28 | 31 | 4 | — | |
| G18 | 6 | 25 | 3 | — | 5 | 24 | 31 | 6 | — | |
| G19 | 6 | 29 | 2 | 5 | 1 | 19 | 18 | 20 | — | |
| G20* | 6 | 30 | 5 | — | — | 19 | 18 | 22 | — | |
| G21* | 6 | 30 | — | — | 5 | 20 | 15 | 8 | 16 | |
| G22 | 6 | 27 | 3 | 1 | 4 | 20 | 16.5 | 8 | 14.5 | |
| G23* | 5 | 25 | 27 | — | — | 17 | 19 | 7 | — | |
| G24 | 5 | 23 | 25 | — | — | 18 | 23 | 6 | — | |
| G25 | 4 | 33 | 16 | — | — | 17 | 23 | 7 | — | |
| G26* | 6 | 28 | 1 | 16 | — | 18 | 24 | 7 | — | |
| G27 | 6 | 35 | 1 | 10 | — | 19 | 23 | 6 | — | |
| G28* | 6 | 22 | 1 | — | 27 | 16 | 22 | 6 | — | |
| G29 | 6 | 22 | 1 | — | 25 | 18 | 20 | 8 | — | |
| G30 | 6 | 32 | 1 | — | 12 | 19 | 23 | 7 | — | |

In Table 1, glass sample numbers marked with * represent glass powders outside the scope of preferred embodiments of the present invention. Note that, in the "Remarks" column in Table 1, the term "devitrified" means that the blended composition could not be formed into glass (i.e., could not be vitrified). More specifically, it refers to a case in which the resulting glass did not become amorphous, a portion of the glass crystallized, and the glass was not transparent.

Next, a SrZrO$_3$ powder, a SrTiO$_3$ powder, and one of Glass powders G1 to G7, G10 to G12, and G14 to G30, all of which were not "devitrified" in Table 1, were mixed so as to have the composition ratios shown in Table 2. Appropriate amounts of vinyl acetate and purified water were added to each of the mixed powder, and mixed by a wet method. The resulting mixtures were granulated to prepare powders used for Samples 1 to 32.

Next, each of the resulting powders was pressed at a pressure of about 2 ton/cm$^2$ with a dry press machine to prepare disc-shaped compacts having a diameter of about 20 mm and a thickness of about 1 mm.

Next, the compacts were left to stand at a temperature of about 400° C. in air for about two hours to remove the vinyl acetate used as a binder. Subsequently, the compacts were fired in a reducing atmosphere (i.e., a nitrogen atmosphere) at a temperature of about 980° C. for about two hours. Sintered bodies of Samples 1 to 32 were obtained.

Next, as shown in Table 2, the relative dielectric constant $\epsilon_r$, the Q value, and the temperature coefficient of dielectric constant (TCC), and insulation reliability of the sintered bodies were evaluated.

The relative dielectric constant ($\epsilon_r$), the Q value, and the temperature coefficient of dielectric constant (TCC) were measured at a temperature of about 20° C. under the conditions of about 1 MHz and about 1 Vrms. The Q value was converted to Qf at about 1 GHz.

For the insulation reliability, the insulation resistance was measured after a direct-current voltage of about 10 V was continuously applied for about 1,000 hours under the conditions of a temperature of about 85° C. and a humidity of about 85% RH. When the insulation resistance was about 10$^{10}$Ω or more, the insulation resistance was considered to be good, and the result was denoted by "○".

TABLE 2

| Sample No. | SrZrO$_3$ content (wt %) | SrTiO$_3$ content (wt %) | Type of glass | Glass content (wt %) | $\epsilon_r$ | Qf (GHz) | TCC (ppm/° C.) | Insulation reliability |
|---|---|---|---|---|---|---|---|---|
| 1* | 89.0 | 3.0 | G1 | 8.0 | | Not sintered | | |
| 2 | 89.0 | 3.0 | G2 | 8.0 | 28.0 | 19500 | 40 | ○ |
| 3 | 89.0 | 3.0 | G3 | 8.0 | 29.1 | 21500 | 35 | ○ |
| 4* | 89.0 | 3.0 | G4 | 8.0 | 30.0 | 25000 | 25 | X |
| 5* | 89.0 | 3.0 | G5 | 8.0 | 30.6 | 4300 | 50 | ○ |
| 6 | 89.0 | 3.0 | G6 | 8.0 | 29.4 | 9000 | 40 | ○ |
| 7 | 89.0 | 3.0 | G7 | 8.0 | 28.6 | 27000 | 22 | ○ |
| 8 | 89.0 | 3.0 | G10 | 8.0 | 29.8 | 19000 | 21 | ○ |
| 9 | 89.0 | 3.0 | G11 | 8.0 | 29.0 | 17000 | 25 | ○ |
| 10* | 89.0 | 3.0 | G12 | 8.0 | 31.2 | 25000 | 15 | X |
| 11 | 89.0 | 3.0 | G14 | 8.0 | 30.9 | 24000 | 17 | ○ |

TABLE 2-continued

| Sample No. | SrZrO$_3$ content (wt %) | SrTiO$_3$ content (wt %) | Type of glass | Glass content (wt %) | $\epsilon_r$ | Qf (GHz) | TCC (ppm/° C.) | Insulation reliability |
|---|---|---|---|---|---|---|---|---|
| 12 | 89.0 | 3.0 | G15 | 8.0 | 28.3 | 20000 | 25 | ○ |
| 13* | 89.0 | 3.0 | G16 | 8.0 | | Not sintered | | |
| 14* | 89.0 | 3.0 | G17 | 8.0 | 29.2 | 23000 | 27 | X |
| 15 | 89.0 | 3.0 | G18 | 8.0 | 29.3 | 28000 | 15 | ○ |
| 16 | 89.0 | 3.0 | G19 | 8.0 | 30.2 | 26000 | 20 | ○ |
| 17* | 89.0 | 3.0 | G20 | 8.0 | 30.3 | 25000 | 19 | X |
| 18* | 89.0 | 3.0 | G21 | 8.0 | | Not sintered | | |
| 19 | 89.0 | 3.0 | G22 | 8.0 | 27.9 | 17000 | 28 | ○ |
| 20* | 89.0 | 3.0 | G23 | 8.0 | 30.6 | 1600 | 22 | ○ |
| 21 | 89.0 | 3.0 | G24 | 8.0 | 28.8 | 9000 | 18 | ○ |
| 22 | 89.0 | 3.0 | G25 | 8.0 | 28.7 | 17000 | 16 | ○ |
| 23* | 89.0 | 3.0 | G26 | 8.0 | 29.5 | 14000 | 12 | X |
| 24 | 89.0 | 3.0 | G27 | 8.0 | 29.4 | 16000 | 15 | ○ |
| 25* | 89.0 | 3.0 | G28 | 8.0 | 29.9 | 4500 | 18 | ○ |
| 26 | 89.0 | 3.0 | G29 | 8.0 | 29.4 | 11000 | 19 | ○ |
| 27 | 89.0 | 3.0 | G30 | 8.0 | 28.9 | 23000 | 16 | ○ |
| 28* | 96.5 | 3.0 | G15 | 0.5 | | Not sintered | | |
| 29 | 96.0 | 3.0 | G15 | 1.0 | 31.7 | 31000 | 10 | ○ |
| 30 | 95.0 | 3.0 | G15 | 2.0 | 31.2 | 31000 | 14 | ○ |
| 31 | 85.0 | 3.0 | G15 | 12.0 | 24.0 | 20000 | 60 | ○ |
| 32* | 82.0 | 3.0 | G15 | 15.0 | 20.2 | 9000 | 16 | ○ |
| 33* | 90.0 | 8.0 | G15 | 2.0 | 36.0 | 24000 | −240 | ○ |
| 34 | 92.0 | 6.0 | G15 | 2.0 | 33.2 | 30000 | −120 | ○ |
| 35 | 98.0 | 0.0 | G15 | 2.0 | 28.5 | 30000 | 120 | ○ |

In Table 2, sample numbers marked with * represent samples outside the scope of preferred embodiments of the present invention.

In the compositions shown in Table 2, SrZrO$_3$ contributes to an increase in the relative dielectric constant ($\in$r), and SrTiO$_3$ contributes to an increase in the Q value. On the other hand, the glass contributes to the achievement of sintering at a low temperature of about 1,050° C. or lower and contributes to an increase in the Q value by precipitation of the above-mentioned specific crystal phase. In addition, ceramics, such as SrZrO$_3$ and SrTiO$_3$, have a Q value higher than that of the glass.

In Sample 32, since the glass content was about 15.0 weight percent, which exceeded about 12 weigh percent, $\in_r$ was relatively low. In contrast, in Sample 28, since the glass content was about 0.5 weight percent, which was less than about 1 weigh percent, sintering did not occur at the above-mentioned firing temperature of about 980° C.

In Sample 33, the SrTiO$_3$ content was about 8.0 weight percent, which exceeded about 6 weight percent. The TCC of SrTiO$_3$ is a large negative value. Accordingly, the TCC of Sample 33 was a large negative value.

Next, the compositions of the glass will be discussed.

Sample 1 did not sinter. Sample 1 included Glass G1. As shown in Table 1, the Li$_2$O content of Glass G1 was less than about 3.5 weight percent. Lithium oxide (Li$_2$O) has a function of decreasing the softening point of the glass and allowing the composition to readily sinter. The reason that sintering did not occur as described above is that the Li$_2$O content was too low.

The insulation reliability of Sample 4 was low. Sample 4 included Glass G4. As shown in Table 1, the Li$_2$O content of Glass G4 exceeded about 15 weight percent. When the Li$_2$O content was too high as in this case, chemical stability of the glass decreased. Consequently, the insulation reliability decreased as described above.

The Qf of Sample 5 was small. Sample 5 included Glass G5. As shown in Table 1, the MgO content of Glass G5 was less than about 20 weight percent. Therefore, a crystal phase including, for example, Mg$_3$B$_2$O$_6$ that provides a high Q value did not precipitate. As a result, the Qf was small as described above.

In contrast to Glass G5, in Glass G8, the MgO content exceeded about 50 weight percent as shown in Table 1. When the proportion of an alkali metal or an alkaline earth metal increased as in this case, crystallization easily occurred. As a result, "devitrification" occurred as shown in Table 1.

The Qf of Sample 20 was small. Sample 20 included Glass G23. As shown in Table 1, the BaO content of Glass G23 exceeded about 25 weight percent. The reason that the Qf was small as described above is that an alkali metal or an alkaline earth metal that did not crystallize decreased the Q value of the glass (more specifically, the Q value of a crystal phase after firing).

The insulation reliability of Sample 23 was low. Sample 23 included Glass G26. As shown in Table 1, the CaO content of Glass G26 exceeded about 10 weight percent. The reason that the insulation reliability decreased as described above is that the CaO content was too high, and thus chemical stability of the glass decreased.

The Qf of Sample 25 was small. Sample 25 included Glass G28. As shown in Table 1, the SrO content of Glass G28 exceeded about 25 weight percent. The reason that the Qf was small as described above is that an alkali metal or an alkaline earth metal that did not crystallize decreased the Q value of the glass (the Q value of a crystal phase after firing).

The insulation reliability of Sample 10 was low. Sample 10 included Glass G12. As shown in Table 1, the B$_2$O$_3$ content of Glass G12 exceeded about 29 weight percent. The reason that the insulation reliability decreased as described above is that the content of B$_2$O$_3$, which decreases moisture resistance, was too high.

In contrast to Glass G12, in Glass G9, the B$_2$O$_3$ content was less than about 16 weight percent as shown in Table 1. When the content of a glass network-forming oxide such as B$_2$O$_3$ was too small, vitrification became difficult. As a result, "devitrification" occurred as shown in Table 1.

Sample 13 did not sinter. Sample 13 included Glass G16. As shown in Table 1, the SiO$_2$ content of Glass G16 exceeded about 35 weight percent. The reason that sintering did not occur as described above is that the $SiO_2$ content was high, thereby increasing the glass softening point.

In contrast to Glass G16, in Glass G13, the $SiO_2$ content was less than about 11 weight percent as shown in Table 1. When the content of a glass network-forming oxide such as $SiO_2$ was small, vitrification became difficult. As a result, "devitrification" occurred as shown in Table 1.

The insulation reliability of Sample 14 was low. Sample 14 included Glass G17. As shown in Table 1, the ZnO content of Glass G17 was less than about 5 weight percent. The reason that the insulation reliability decreased as described above is that Glass G17 whose ZnO content was too low was used. However, the detailed reason for this is not completely understood.

The insulation reliability of Sample 17 was low. Sample 17 included Glass G20. As shown in Table 1, the ZnO content of Glass G20 exceeded about 20 weight percent. The reason that the insulation reliability decreased as described above is that the ZnO content was too high and thus the moisture resistance of the glass decreased.

Sample 18 did not sinter. Sample 18 included Glass G21. As shown in Table 1, the $Al_2O_3$ content of Glass G21 exceeded about 15 weight percent. When the $Al_2O_3$ content is high, a temperature at which sintering occurs tends to increase. The reason that sintering did not occur as described above is that the $Al_2O_3$ content was too high.

In contrast to the above samples, according to Samples 2, 3, 6 to 9, 11, 12, 15, 16, 19, 21, 22, 24, 26, 27, 29 to 31, 34, and 35, which are within the scope of preferred embodiments of the present invention, an $\in_r$ of at least about 24.0, a Qf of at least about 9,000 GHz, and an absolute value of the TCC of about 150 ppm/° C. or less were achieved, and the insulation reliability was good.

EXPERIMENTAL EXAMPLE 2

In Experimental Example 2, disc-shaped compacts were prepared using $Al_2O_3$ or $MgAl_2O_4$ instead of $SrZrO_3$ in accordance with the same or substantially the same process as that used in Experimental Example 1. Subsequently, a debinding process and a firing process were performed in order to obtain sintered bodies.

More specifically, in Comparative Example 1, Glass G15 was used as the glass, and the glass content was about 8 weight percent. As ceramics, $Al_2O_3$ and $SrTiO_3$ were used, the $Al_2O_3$ content was about 89 weight percent, and the $SrTiO_3$ content was about 3.0 weight percent. Although the experiment was performed in order to obtain a sintered body as described above, the prepared compact did not sinter.

In Comparative Example 2, Glass G15 was used as the glass, and the glass content was about 20 weight percent. As ceramics, $Al_2O_3$ and $SrTiO_3$ were used, the $Al_2O_3$ content was about 77 weight percent, and the $SrTiO_3$ content was about 3.0 weight percent. Although the experiment was performed in order to obtain a sintered body as described above, the prepared compact did not sinter. Note that although the glass content was about 20 weight percent in Comparative Example 2, sintering did not occur.

In Comparative Example 3, Glass G15 was used as the glass, and the glass content was about 8 weight percent. As ceramics, $MgAl_2O_4$ and $SrTiO_3$ were used, the $MgAl_2O_4$ content was about 89 weight percent, and the $SrTiO_3$ content was about 3.0 weight percent. Although the experiment was performed in order to obtain a sintered body as described above, the prepared compact did not sinter.

In Comparative Example 4, Glass G15 was used as the glass, and the glass content was about 20 weight percent. As ceramics, $MgAl_2O_4$ and $SrTiO_3$ were used, the $MgAl_2O_4$ content was about 77 weight percent, and the $SrTiO_3$ content was about 3.0 weight percent. Although the experiment was performed in order to obtain a sintered body as described above, the prepared compact did not sinter. Note that although the glass content was about 20 weight percent in Comparative Example 4, sintering did not occur.

EXPERIMENTAL EXAMPLE 3

In Experimental Example 3, experiments for verifying the effects of further including $BaZrO_3$ and $Mg_2SiO_4$ in the glass ceramic composition according to a preferred embodiment of the present invention were performed.

In addition to a $SrZrO_3$ powder and a $SrTiO_3$ powder, a $BaZrO_3$ powder and an $Mg_2SiO_4$ powder were prepared. Next, the powder, the $BaZrO_3$ powder, the $SrTiO_3$ powder, the $Mg_2SiO_4$ powder, and one of Glass powders G1 to G7, G10 to G12, and G14 to G30, which are shown in Table 1 above, were mixed so as to produce the composition ratios shown in Tables 3 and 4. Appropriate amounts of vinyl acetate and purified water were added to each of the mixed powder, and mixed by a wet method. The resulting mixtures were granulated to prepare powders used for Samples 101 to 144.

Note that the type and the content of glass of Samples 101 to 127, 129 to 135, and 137 shown in Tables 3 and 4 were substantially the same as those of samples 1 to 35, respectively, shown in Table 2 except that some of $SrZrO_3$ was replaced with $BaZrO_3$.

In addition, Table 4 shows Samples 3, 11, and 22 shown in Table 2 again. This is because a "rate of change in capacitance", which was not evaluated in Experimental Example 1, is compared between these samples and other samples.

Thereafter, the same procedure as that in the case of Experimental Example 1 was performed to prepare sintered bodies of Samples 101 to 144. As shown in Tables 3 and 4, the relative dielectric constant $\in_r$, the Q value, and the temperature coefficient of dielectric constant (TCC), and insulation reliability of each of the sintered bodies were evaluated by substantially the same methods as those used in Experimental Example 1.

In Experimental Example 3, for Samples 101 to 144, and Samples 3, 11, and 21, which were obtained in Experimental Example 1, the rate of change in capacitance was further evaluated. An accelerated test of monolithic capacitors prepared for the evaluation of the insulation reliability was performed by applying a DC voltage of about 200 V at a temperature of about 150° C. for about 100 hours. The rate of change in capacitance was determined by the following formula:

$$\text{Rate of change in capacitance } [\%] = \{(C_1 - C_0)/C_0\} \times 100$$

wherein $C_0$ represents the capacitance before the test, and $C_1$ represents the capacitance after the test.

TABLE 3

| Sample No. | SrZrO$_3$ content (wt %) | BaZrO$_3$ content (wt %) | SrTiO$_3$ content (wt %) | Mg$_2$SiO$_4$ content (wt %) | Type of glass | Glass content (wt %) | $\epsilon_r$ | Qf (GHz) | TCC (ppm/° C.) | Insulation reliability | Rate of change in capacitance (%) |
|---|---|---|---|---|---|---|---|---|---|---|---|
| 101 * | 45.0 | 44.0 | 3.0 | — | G1  | 8.0 | | | Not sintered | | |
| 102   | 45.0 | 44.0 | 3.0 | — | G2  | 8.0 | 30.2 | 18500 | 32  | ○ | 0.12 |
| 103   | 65.0 | 24.0 | 3.0 | — | G3  | 8.0 | 32.3 | 19000 | 15  | ○ | 0.03 |
| 104 * | 30.0 | 59.0 | 3.0 | — | G4  | 8.0 | 31.4 | 22000 | −21 | X | — |
| 105 * | 70.0 | 19.0 | 3.0 | — | G5  | 8.0 | 32.7 | 3000  | 42  | ○ | 0.03 |
| 106   | 88.0 | 1.0  | 3.0 | — | G6  | 8.0 | 34.8 | 12000 | 30  | ○ | 0.01 |
| 107   | 50.0 | 39.0 | 3.0 | — | G7  | 8.0 | 29.8 | 24500 | 36  | ○ | 0.14 |
| 108   | 59.0 | 30.0 | 3.0 | — | G10 | 8.0 | 32.6 | 17000 | 35  | ○ | 0.03 |
| 109   | 5.0  | 84.0 | 3.0 | — | G11 | 8.0 | 24.4 | 16000 | −34 | ○ | 0.11 |
| 110 * | 65.0 | 24.0 | 3.0 | — | G12 | 8.0 | 32.1 | 23000 | 22  | X | — |
| 111   | 60.0 | 29.0 | 3.0 | — | G14 | 8.0 | 32.4 | 22000 | 25  | ○ | 0.02 |
| 112   | 60.0 | 29.0 | 3.0 | — | G15 | 8.0 | 30.1 | 19000 | 16  | ○ | 0.02 |
| 113 * | 15.0 | 74.0 | 3.0 | — | G16 | 8.0 | | | Not sintered | | |
| 114 * | 87.0 | 2.0  | 3.0 | — | G17 | 8.0 | 31.0 | 22000 | 41  | X | — |
| 115   | 44.0 | 45.0 | 3.0 | — | G18 | 8.0 | 32.2 | 26000 | 29  | ○ | 0.13 |
| 116   | 49.0 | 40.0 | 3.0 | — | G19 | 8.0 | 32.0 | 24000 | 24  | ○ | 0.14 |
| 117 * | 30.0 | 59.0 | 3.0 | — | G20 | 8.0 | 33.4 | 26000 | 8   | X | — |
| 118 * | 59.0 | 30.0 | 3.0 | — | G21 | 8.0 | | | Not sintered | | |
| 119   | 20.0 | 69.0 | 3.0 | — | G22 | 8.0 | 29.3 | 19000 | −16 | ○ | 0.11 |
| 120 * | 70.0 | 19.0 | 3.0 | — | G23 | 8.0 | 32.2 | 2000  | 26  | ○ | 0.02 |
| 121   | 30.0 | 59.0 | 3.0 | — | G24 | 8.0 | 29.9 | 11000 | 12  | ○ | 0.12 |
| 122   | 60.0 | 29.0 | 3.0 | — | G25 | 8.0 | 33.0 | 16000 | 17  | ○ | 0.04 |
| 123 * | 54.0 | 35.0 | 3.0 | — | G26 | 8.0 | 32.4 | 13000 | 10  | X | — |
| 124   | 40.0 | 49.0 | 3.0 | — | G27 | 8.0 | 32.3 | 12000 | 26  | ○ | 0.13 |

TABLE 4

| Sample No. | SrZrO$_3$ content (wt %) | BaZrO$_3$ content (wt %) | SrTiO$_3$ content (wt %) | Mg$_2$SiO$_4$ content (wt %) | Type of glass | Glass content (wt %) | $\epsilon_r$ | Qf (GHz) | TCC (ppm/° C.) | Insulation reliability | Rate of change in capacitance (%) |
|---|---|---|---|---|---|---|---|---|---|---|---|
| 125 * | 34.0 | 55.0 | 3.0 | — | G28 | 8.0  | 30.3 | 3500  | 14   | ○ | 0.12 |
| 126   | 10.0 | 79.0 | 3.0 | — | G29 | 8.0  | 27.7 | 11000 | 12   | ○ | 0.11 |
| 127   | 69.0 | 20.0 | 3.0 | — | G30 | 8.0  | 29.1 | 20000 | 23   | ○ | 0.01 |
| 128   | 3.0  | 86.0 | 3.0 | — | G11 | 8.0  | 27.1 | 8000  | −62  | ○ | 0.14 |
| 129 * | 16.5 | 80.0 | 3.0 | — | G15 | 0.5  | | | Not sintered | | |
| 130   | 20.0 | 76.0 | 3.0 | — | G15 | 1.0  | 28.8 | 29000 | −11  | ○ | 0.13 |
| 131   | 80.0 | 15.0 | 3.0 | — | G15 | 2.0  | 32.9 | 27000 | 30   | ○ | 0.04 |
| 132   | 20.0 | 65.0 | 3.0 | — | G15 | 12.0 | 26.8 | 18000 | −31  | ○ | 0.12 |
| 133 * | 2.0  | 80.0 | 3.0 | — | G15 | 15.0 | 23.4 | 8000  | 16   | ○ | 0.12 |
| 134 * | 85.0 | 5.0  | 8.0 | — | G15 | 2.0  | 38.1 | 23000 | −310 | ○ | 0.03 |
| 135   | 70.0 | 22.0 | 6.0 | — | G15 | 2.0  | 35.0 | 29000 | −118 | ○ | 0.04 |
| 136   | 70.0 | 22.0 | 1.0 | — | G15 | 2.0  | 35.0 | 29000 | −30  | ○ | 0.04 |
| 137   | 25.0 | 73.0 | 0.0 | — | G15 | 2.0  | 30.2 | 28000 | 16   | ○ | 0.14 |
| 138   | 25.0 | 68.0 | 0.0 | 5  | G15 | 2.0  | 29.4 | 32000 | 46   | ○ | 0.03 |
| 139   | 20.0 | 38.0 | 0.0 | 40 | G15 | 2.0  | 23.1 | 35000 | 63   | ○ | 0.02 |
| 140   | 20.0 | 33.0 | 0.0 | 45 | G15 | 2.0  | 19.6 | 36000 | 81   | ○ | 0.03 |
| 141   | 84.0 | 0.0  | 3.0 | 5  | G3  | 8.0  | 28.2 | 25000 | 23   | ○ | 0.31 |
| 142   | 49.0 | 0.0  | 3.0 | 40 | G3  | 8.0  | 23.0 | 28000 | 16   | ○ | 0.33 |
| 143   | 44.0 | 0.0  | 3.0 | 45 | G3  | 8.0  | 18.8 | 32000 | 12   | ○ | 0.31 |
| 144   | 44.0 | 5.0  | 3.0 | 40 | G3  | 8.0  | 23.3 | 28000 | −11  | ○ | 0.03 |
| 3     | 89.0 | 0.0  | 3.0 | 0  | G3  | 8.0  | 29.1 | 21500 | 35   | ○ | 0.32 |
| 11    | 89.0 | 0.0  | 3.0 | 0  | G14 | 8.0  | 30.9 | 24000 | 17   | ○ | 0.32 |
| 22    | 89.0 | 0.0  | 3.0 | 0  | G24 | 8.0  | 28.8 | 9000  | 18   | ○ | 0.35 |

In Tables 3 and 4, sample numbers marked with * represent samples outside the scope of preferred embodiments of the present invention.

As described above, Samples 101 to 127, 129 to 135, and 137 shown in Tables 3 and 4 correspond to samples 1 to 35, respectively, which are shown in Table 2, in that the type and the content of glass are substantially the same except that some of SrZrO$_3$ is replaced with BaZrO$_3$. Accordingly, very similar tendencies were observed between Samples 101 to 127, 129 to 135, and 137, and samples 1 to 32.

First, in Sample 133, which corresponds to Sample 32, since the glass content was about 15.0 weight percent, which exceeded about 12 weight percent, $\epsilon_r$ was relatively low. In contrast, in sample 129, which corresponds to Sample 28, since the glass content was about 0.5 weight percent, which was less than about 1 weigh percent, sintering did not occur at the above-mentioned firing temperature of about 980° C.

In Sample 134, which corresponds to Sample 33, since the SrTiO$_3$ content was about 8.0 weight percent, which exceeded about 6 weight percent, the TCC was a large negative value.

Next, the compositions of the glass will be discussed.

Sample 101, which corresponds to Sample 1, did not sinter. This is because Sample 101 includes Glass G1 including Li$_2$O in an amount less than about 3.5 weight percent. In contrast, in Sample 104, which corresponds to Sample 4, the insulation reliability of was low. This is because Sample 104 includes Glass G4 including $Li_2O$ in an amount exceeding about 15 weight percent.

In Sample 105, which corresponds to Sample 5, the Qf was small. This is because Sample 105 includes Glass G5 including MgO in an amount less than about 20 weight percent.

In Sample 120, which corresponds to Sample 20, the Qf was small. This is because Sample 120 includes Glass G23 including BaO in an amount exceeding about 25 weight percent.

In Sample 123, which corresponds to Sample 23, the insulation reliability was low. This is because Sample 123 includes Glass G26 including CaO in an amount exceeding about 10 weight percent.

In Sample 125, which corresponds to Sample 25, the Qf was small. This is because Sample 125 includes Glass G28 including SrO in an amount exceeding about 25 weight percent.

In Sample 110, which corresponds to Sample 10, the insulation reliability was low. This is because Sample 110 includes Glass G12 including $B_2O_3$ in an amount exceeding about 29 weight percent.

Sample 113, which corresponds to Sample 13, did not sinter. This is because Sample 113 includes Glass G16 including $SiO_2$ in an amount exceeding about 35 weight percent.

In Sample 114, which corresponds to Sample 14, the insulation reliability of was low. This is because Sample 114 includes Glass G17 including ZnO in an amount less than about 5 weight percent. On the other hand, in Sample 117, which corresponds to Sample 17, the insulation reliability was low. This is because Sample 117 includes Glass G20 including ZnO in an amount exceeding about 20 weight percent.

Sample 118, which corresponds to Sample 18, did not sinter. This is because Sample 118 includes Glass G21 including $Al_2O_3$ in an amount exceeding about 15 weight percent.

In contrast to the above samples, according to Samples 102, 103, 106 to 109, 111, 112, 115, 116, 119, 121, 122, 124, 126, 127, 130 to 132, 135, and 137, which correspond to Samples 1 to 35, respectively, an $\in_r$ of at least about 24.0, a Qf of at least about 9,000 GHz, and an absolute value of the TCC of about 150 ppm/° C. or less could be achieved, and the insulation reliability was good.

From the standpoint of the rate of change in capacitance, as is apparent from the comparison between Samples 3, 11, and 22, which do not include $BaZrO_3$, shown in Table 4, and Samples 102, 103, 106 to 109, 111, 112, 115, 116, 119, 121, 122, 124, 126, 127, 130 to 132, 135, and 137, which are within the scope of preferred embodiments of the present invention, in particular, corresponding Samples 103, 111, and 122, respectively, the rate of change in capacitance could be decreased by including $BaZrO_3$.

In particular, according to Samples 103, 106, 108, 111, 112, 122, 127, 131, and 135, all of which include $BaZrO_3$ in an amount of about 30 weight percent or less, the rate of change in capacitance could be further decreased.

The result of Sample 128 shows that the upper limit of the $BaZrO_3$ content is preferably about 84 weight percent. Specifically, in Sample 128, which includes $BaZrO_3$ in an amount exceeding about 84 weight percent, the Qf was only about 8,000, and the absolute value of the TCC exceeded about 50 ppm/° C.

In Samples 134 to 137 shown in Table 4, the $SrTiO_3$ content was varied. $SrTiO_3$ is a material having a high dielectric constant, a large negative TCC, and a high Q value. As is apparent from the comparison between Sample 137, which does not include $SrTiO_3$, with Samples 134 to 136, which include $SrTiO_3$, by incorporating $SrTiO_3$, the relative dielectric constant $\in_r$ can be improved without decreasing the Qf, and the TCC can be changed in the negative direction. Note that, as in Sample 134, a $SrTiO_3$ content exceeding about 6 weight percent is not preferable because the TCC becomes too large in the negative direction.

In Samples 138 to 144 shown in Table 4, $Mg_2SiO_4$ was included, and the content thereof was varied. Since Samples 138 to 144 included $Mg_2SiO_4$, the Qf could be further improved. However, in Samples 140 and 143, which include $Mg_2SiO_4$ in an amount exceeding about 40 weight percent, the relative dielectric constant $\in_r$ was low. Accordingly, it is preferable that $Mg_2SiO_4$ be included in an amount of about 40 weight percent or less.

Note that, among Samples 138 to 144, Samples 138 to 140 do not include $SrTiO_3$, and Samples 141 to 143 do not include $BaZrO_3$. Accordingly, these results show that the effect of including $Mg_2SiO_4$ is achieved regardless of whether $BaZrO_3$ or $SrTiO_3$ are included.

EXPERIMENTAL EXAMPLE 4

In Experimental Example 4, experiments for verifying an effect of further including $TiO_2$ in the glass ceramic composition according to preferred embodiments of the present invention were performed.

In addition to a $SrZrO_3$ powder, a $BaZrO_3$ powder, a powder, and an $Mg_2SiO_4$ powder, a $TiO_2$ powder was prepared. Next, the $SrZrO_3$ powder, the $BaZrO_3$ powder, the powder, the $Mg_2SiO_4$ powder, the $TiO_2$ powder, and one of Glass powders G1 to G4 and G15, which are shown in Table 1 above, were mixed so as to have the composition ratios shown in Table 5. Appropriate amounts of vinyl acetate and purified water were added to each of the mixed powder, and mixed by a wet method. The resulting mixtures were granulated to prepare powders used for Samples 201 to 218.

Note that, among Samples 201 to 218 shown in Table 5, Sample 202 is substantially the same as Sample 102 shown in Table 3, Sample 207 is substantially the same as Sample 2 shown in Table 2, Sample 209 is substantially the same as Sample 35 shown in Table 2, and Sample 211 is substantially the same as Sample 3 shown in Table 3.

Thereafter, the same procedure as that in the case of Experimental Example 1 was performed to prepare the sintered bodies of Samples 201 to 218. As shown in Table 5, the relative dielectric constant $\in_r$, the Q value, and the temperature coefficient of dielectric constant (TCC), and insulation reliability of each of the sintered bodies were evaluated by substantially the same methods as those used in Experimental Example 1.

TABLE 5

| Sample No. | $SrZrO_3$ content (wt %) | $BaZrO_3$ content (wt %) | $SrTiO_3$ content (wt %) | $Mg_2SiO_4$ content (wt %) | $TiO_2$ content (wt %) | Type of glass | Glass content (wt %) | $\in_r$ | Qf (GHz) | TCC (ppm/° C.) | Insulation reliability |
|---|---|---|---|---|---|---|---|---|---|---|---|
| 201 | 41.0 | 45.0 | 3.0 | 0.0 | 3.0 | G1 | 8.0 | | Not sintered | | |
| 202 | 45.0 | 44.0 | 3.0 | 0.0 | 0.0 | G2 | 8.0 | 30.2 | 18500 | 32 | ○ |
| 203 | 44.0 | 44.0 | 3.0 | 0.0 | 1.0 | G2 | 8.0 | 30.8 | 18000 | 26 | ○ |
| 204 | 42.0 | 44.0 | 3.0 | 0.0 | 3.0 | G2 | 8.0 | 31.3 | 17000 | 5 | ○ |
| 205 | 35.0 | 44.0 | 3.0 | 0.0 | 10.0 | G2 | 8.0 | 32.1 | 15000 | −98 | ○ |

TABLE 5-continued

| Sample No. | SrZrO$_3$ content (wt %) | BaZrO$_3$ content (wt %) | SrTiO$_3$ content (wt %) | Mg$_2$SiO$_4$ content (wt %) | TiO$_2$ content (wt %) | Type of glass | Glass content (wt %) | $\epsilon_r$ | Qf (GHz) | TCC (ppm/°C.) | Insulation reliability |
|---|---|---|---|---|---|---|---|---|---|---|---|
| 206 | 30.0 | 44.0 | 3.0 | 0.0 | 15.0 | G2 | 8.0 | 34.5 | 10000 | −155 | ○ |
| 207 | 89.0 | 0.0 | 3.0 | 0.0 | 0.0 | G2 | 8.0 | 28.0 | 19500 | 40 | ○ |
| 208 | 87.0 | 0.0 | 3.0 | 0.0 | 2.0 | G2 | 8.0 | 28.7 | 18000 | 13 | ○ |
| 209 | 98.0 | 0.0 | 0.0 | 0.0 | 0.0 | G15 | 2.0 | 28.5 | 30000 | 120 | ○ |
| 210 | 92.0 | 0.0 | 0.0 | 0.0 | 6.0 | G15 | 2.0 | 30.5 | 27000 | 12 | ○ |
| 211 | 65.0 | 24.0 | 3.0 | 0.0 | 0.0 | G3 | 8.0 | 32.3 | 19000 | 15 | ○ |
| 212 | 64.0 | 24.0 | 3.0 | 0.0 | 1.0 | G3 | 8.0 | 32.8 | 18000 | −10 | ○ |
| 213 | 55.0 | 24.0 | 3.0 | 5.0 | 5.0 | G3 | 8.0 | 29.1 | 15000 | −15 | ○ |
| 214 | 50.0 | 24.0 | 3.0 | 5.0 | 10.0 | G3 | 8.0 | 29.8 | 14000 | −43 | ○ |
| 215 | 17.0 | 24.0 | 3.0 | 40.0 | 8.0 | G3 | 8.0 | 24.3 | 13000 | 24 | ○ |
| 216 | 15.0 | 24.0 | 3.0 | 40.0 | 10.0 | G3 | 8.0 | 24.5 | 13000 | 20 | ○ |
| 217 | 10.0 | 24.0 | 3.0 | 45.0 | 10.0 | G3 | 8.0 | 19.5 | 11000 | 13 | ○ |
| 218 | 27.0 | 59.0 | 3.0 | 0.0 | 3.0 | G4 | 8.0 | 32.4 | 21000 | −34 | X |

Sample 201 did not sinter. This is because Sample 201 includes Glass G1 including Li$_2$O in an amount less than about 3.5 weight percent. In contrast, in Sample 218, the insulation reliability was low. This is because Sample 218 includes Glass G4 including Li$_2$O in an amount exceeding about 15 weight percent.

In Samples 202 to 206, some of SrZrO$_3$ was replaced with TiO$_2$, and the amount of replacement with TiO$_2$ was varied. Comparing Samples 202 to 206, the results show that the incorporation of TiO$_2$ and the content thereof affect the TCC.

Similarly, comparing Sample 207 to Sample 208, Sample 209 to Sample 210, Sample 211 to Sample 212, Sample 213 to Sample 214, and Sample 215 to Sample 216, the results show that the inclusion of TiO$_2$ and the amount thereof affect the TCC as described above.

Furthermore, comparing Samples 202 to 206, the absolute value of the TCC of Sample 204 including TiO$_2$ in an amount of about 3.0 weight percent was less than that of Sample 203 including TiO$_2$ in an amount of about 1.0 weight percent and that of Sample 202 not including TiO$_2$. In addition, the absolute value of the TCC of Sample 205 including TiO$_2$ in an amount of about 10.0 weight percent was less than that of Sample 206 including TiO$_2$ in an amount of about 15.0 weight percent. According to these results, the TCC can be further stabilized by including TiO$_2$ in an amount in the range of about 3 to about 10 weight percent.

The above also applies to Samples 210, 213, and 214 to 217, which include TiO$_2$ in an amount in the range of about 3 to about 10 weight percent.

EXPERIMENTAL EXAMPLE 5

In Experimental Example 5, experiments to verify an effect of further including ZrO$_2$ in the glass ceramic composition according to preferred embodiments of the present invention were performed.

In addition to a SrZrO$_3$ powder, a BaZrO$_3$ powder, a powder, an Mg$_2$SiO$_4$ powder, and a TiO$_2$ powder, a ZrO$_2$ powder was prepared. Next, the SrZrO$_3$ powder, the BaZrO$_3$ powder, the powder, the Mg$_2$SiO$_4$ powder, the TiO$_2$ powder, the ZrO$_2$ powder, and one of Glass powders G1 to G4, which are shown in Table 1 above, were mixed so as to have the composition ratios shown in Table 6. Appropriate amounts of vinyl acetate and purified water were added to each of the mixed powder, and mixed by a wet method. The resulting mixtures were granulated to prepare powders used for Samples 301 to 314.

Note that, among Samples 301 to 314 shown in Table 6, Sample 302 is substantially the same as Sample 102 shown in Table 3, and Sample 307 is substantially the same as Sample 3 shown in Table 3.

Thereafter, substantially the same procedure as that in the case of Experimental Example 1 was performed to prepare sintered bodies of Samples 301 to 314. As shown in Table 6, the relative dielectric constant $\epsilon_r$, the Q value, and the temperature coefficient of dielectric constant (TCC), and insulation reliability of each of the sintered bodies were evaluated by the same methods as those used in Experimental Example 1.

TABLE 6

| Sample No. | SrZrO$_3$ content (wt %) | BaZrO$_3$ content (wt %) | SrTiO$_3$ content (wt %) | Mg$_2$SiO$_4$ content (wt %) | TiO$_2$ content (wt %) | ZrO$_2$ content (wt %) | Type of glass | Glass content (wt %) | $\epsilon_r$ | Qf (GHz) | TCC (ppm/°C.) | Insulation reliability |
|---|---|---|---|---|---|---|---|---|---|---|---|---|
| 301 | 44.0 | 42.0 | 3.0 | 0.0 | 0.0 | 3.0 | G1 | 8.0 | | Not sintered | | |
| 302 | 45.0 | 44.0 | 3.0 | 0.0 | 0.0 | 0.0 | G2 | 8.0 | 30 | 18500 | 30 | ○ |
| 303 | 45.0 | 43.8 | 3.0 | 0.0 | 0.0 | 0.2 | G2 | 8.0 | 30 | 25000 | 30 | ○ |
| 304 | 43.0 | 43.0 | 3.0 | 0.0 | 0.0 | 3.0 | G2 | 8.0 | 29 | 31000 | 30 | ○ |
| 305 | 42.0 | 41.0 | 3.0 | 0.0 | 0.0 | 6.0 | G2 | 8.0 | 26 | 24000 | 40 | ○ |
| 306 | 40.0 | 41.0 | 3.0 | 0.0 | 0.0 | 8.0 | G2 | 8.0 | | Not sintered | | |
| 307 | 65.0 | 24.0 | 3.0 | 0.0 | 0.0 | 0.0 | G3 | 8.0 | 32 | 19000 | 15 | ○ |
| 308 | 63.0 | 23.0 | 3.0 | 0.0 | 0.0 | 3.0 | G3 | 8.0 | 31 | 33000 | 10 | ○ |
| 309 | 58.0 | 23.0 | 3.0 | 5.0 | 0.0 | 3.0 | G3 | 8.0 | 26 | 35000 | 15 | ○ |
| 310 | 60.0 | 23.0 | 3.0 | 0.0 | 3.0 | 3.0 | G3 | 8.0 | 32 | 31000 | −5 | ○ |
| 311 | 53.0 | 23.0 | 3.0 | 5.0 | 5.0 | 3.0 | G3 | 8.0 | 28 | 32000 | −10 | ○ |
| 312 | 23.0 | 23.0 | 3.0 | 40.0 | 0.0 | 3.0 | G3 | 8.0 | 26 | 30000 | 25 | ○ |
| 313 | 18.0 | 23.0 | 3.0 | 45.0 | 0.0 | 3.0 | G3 | 8.0 | 21 | 34000 | 21 | ○ |
| 314 | 29.0 | 57.0 | 3.0 | 0.0 | 0.0 | 3.0 | G4 | 8.0 | 31 | 30000 | −15 | X |

Sample 301 did not sinter. This is because Sample 301 includes Glass G1 including $Li_2O$ in an amount less than about 3.5 weight percent. In contrast, in Sample 314, the insulation reliability thereof was low. This is because Sample 314 includes Glass G4 including $Li_2O$ in an amount exceeding about 15 weight percent.

In Samples 302 to 306, some of $SrZrO_3$ was replaced with $ZrO_2$, and the amount of replacement with $ZrO_2$ was varied. Comparing among Samples 302 to 306, the results show that the incorporation of $ZrO_2$ and the content thereof affect the Qf.

More specifically, comparing Samples 303 to 306 including $ZrO_2$, the Qf of each of Samples 303 to 305 including $ZrO_2$ in an amount of about 6 weight percent or less was greater than the Qf of Sample 302 not including $ZrO_2$. However, Sample 306 including $ZrO_2$ in an amount exceeding about 6 weight percent did not sinter. These results show that the $ZrO_2$ content is preferably about 6 weight percent or less.

Similarly, comparing Sample 307 to Sample 308, the inclusion of $ZrO_2$ improved the Qf as described above. In addition, the results show that the Qf of each of Samples 309 to 313 including $ZrO_2$ was also improved as compared to Sample 302 not including $ZrO_2$.

EXPERIMENTAL EXAMPLE 6

In Experimental Example 6, first glass ceramic layers having a relatively high dielectric constant, the first glass ceramic layers being obtained from a first glass ceramic composition prepared in Experimental Example 3, and second glass ceramic layers having a relatively low dielectric constant, the second glass ceramic layers being obtained from a second glass ceramic composition prepared as described below were laminated, and then fired to prepare monolithic ceramic electronic components each including the first glass ceramic layers and the second glass ceramic layers having different relative dielectric constants.

First, as borosilicate glass powders included in the second glass ceramic composition, Glass samples G3, G5, G10, G12, G18, and G31 to G38 having the compositions shown in Table 7 were prepared and ground until the average particle diameter of the glass samples became in the range of about 1 μm to about 2 μm. Note that Glass samples G3, G5, G10, G12, and G18 shown in Table are substantially the same as Glass samples G3, G5, G10, G12, and G18 shown in Table 1 above.

Meanwhile, an $Mg_2SiO_4$ powder having an average particle diameter (median particle diameter D50) of about 0.8 μm was prepared as a first ceramic powder included in the second glass ceramic composition, and a $CaTiO_3$ powder having an average particle diameter of about 1.5 μm, a $SrTiO_3$ powder having an average particle diameter of about 1.5 μm, and a $TiO_2$ powder having an average particle diameter of about 1.0 μm were prepared as second ceramic powders included in the second glass ceramic composition.

Next, to obtain the second glass ceramic compositions used for the samples shown in Table 8, the above first ceramic powder, one of the borosilicate glass powders, and one or more of the second ceramic powders were mixed.

TABLE 8

| Sample No. | First ceramic (wt %) | Borosilicate glass Type | Content (wt %) | Second ceramic Type | Content (wt %) | Insulation reliability |
|---|---|---|---|---|---|---|
| 401 | 85.0 | G3 | 3.0 | CT | 12.0 | ○ |
| 402 * | 77.0 | G5 | 15.0 | ST | 8.0 | ○ |
| 403 | 75.0 | G10 | 15.0 | ST | 10.0 | ○ |
| 404 * | 78.0 | G12 | 15.0 | CT | 7.0 | X |
| 405 * | 74.0 | G32 | 18.0 | CT | 8.0 | Not sintered |
| 406 | 75.0 | G18 | 15.0 | CT | 10.0 | ○ |
| 407 | 83.5 | G31 | 9.0 | ST/T | 6.5/1.0 | ○ |
| 408 | 80.5 | G31 | 9.0 | ST/T | 7.0/5.5 | ○ |
| 409 | 80.0 | G33 | 10.0 | CT | 10.0 | ○ |
| 410 | 82.0 | G34 | 8.0 | ST | 10.0 | ○ |
| 411 | 75.0 | G35 | 15.0 | CT | 10.0 | ○ |
| 412 | 76.0 | G36 | 14.0 | ST | 10.0 | ○ |
| 413 | 83.0 | G37 | 7.0 | CT | 10.0 | ○ |
| 414 | 81.0 | G38 | 9.0 | ST | 10.0 | ○ |

In Table 8, sample numbers marked with * represent samples outside of the range of the second glass ceramic composition according to preferred embodiments of the present invention.

The column of "first ceramic content" in Table 8 shows the amount of $Mg_2SiO_4$ powder added as the first ceramic powder. The column of "type" in "borosilicate glass" shows "glass sample No." in Table 7, and the column of "content" therein shows the amount of borosilicate glass powder added.

The column of "type" in "second ceramic" shows which of $CaTiO_3$ (=CT), $SrTiO_3$ (=ST), or $TiO_2$ (=T) was used as the second ceramic powder, and the column of "content" in the "second ceramic" shows the amount of second ceramic powder added.

Next, for the second glass ceramic compositions used for the samples shown in Table 8, insulation reliability was evaluated by substantially the same method as that used in Experimental Example 1. The results are shown in Table 8.

TABLE 7

| Glass sample No. | $Li_2O$ (wt %) | MgO (wt %) | BaO (wt %) | CaO (wt %) | SrO (wt %) | $B_2O_3$ (wt %) | $SiO_2$ (wt %) | ZnO (wt %) | $Al_2O_3$ (wt %) |
|---|---|---|---|---|---|---|---|---|---|
| G3 | 15 | 23 | 2 | — | 7 | 20 | 23 | 10 | — |
| G5 * | 6 | 18 | 5 | — | 5 | 26 | 28 | 8 | 4 |
| G10 | 8 | 34 | 3 | 2 | 3 | 16 | 25 | 7 | 2 |
| G12 * | 6 | 23 | 3 | 1 | 6 | 31 | 20 | 10 | — |
| G31 | 5 | 33 | 5 | — | 8 | 18 | 25 | 6 | — |
| G32 * | 6 | 23 | 4 | — | — | 15 | 46 | 6 | — |
| G18 | 6 | 25 | 3 | — | 5 | 24 | 31 | 6 | — |
| G33 | 3 | 21 | — | — | 25 | 15 | 11 | 20 | 5 |
| G34 | 5 | 20 | 25 | — | — | 15 | 10 | 16 | 9 |
| G35 | 4 | 50 | — | 15 | — | 15 | 10 | 6 | — |
| G36 | 5 | 25 | 10 | — | — | 30 | 15 | 15 | — |
| G37 | 5 | 25 | — | 4 | — | 15 | 45 | 6 | — |
| G38 | 5 | 30 | 19 | — | — | 15 | 10 | 6 | 15 |

In Table 7, "glass sample Nos." marked with * represent glass samples outside of the range of the composition of the "borosilicate glass" according to preferred embodiments of the present invention.

As shown in Table 8, Sample 404 includes Glass G12 as the borosilicate glass. As shown in Table 7, Glass G12 includes $B_2O_3$ in an amount exceeding about 30 weight percent. Therefore, Sample 404 had poor insulation reliability.

As shown in Table 8, Sample 405 includes Glass G32 as the borosilicate glass. As shown in Table 7, Glass G32 includes $SiO_2$ in an amount exceeding about 45 weight percent. Therefore, Sample 405 did not sinter at a temperature of about 1,000° C. or lower.

Next, a binder and an organic solvent were added to the first glass ceramic composition used for each of Samples 102, 104, 106, 112, 115, 116, 119, 120, 122, 127, 131, 135, 137, and shown in Table 3 or 4 above, as shown in the column of "sample number in Table 3 or 4 of first glass ceramic composition" in Table 9, to prepare slurries. First glass ceramic green sheets were prepared by a doctor blade method using each of the slurries.

Meanwhile, a binder and an organic solvent were added to the second glass ceramic composition used for each of Samples to 414 shown in Table 8, as shown in the column of "sample number in Table 8 of second glass ceramic composition" in Table 9, to prepare slurries. Second glass ceramic green sheets were prepared by a doctor blade method using each of the slurries.

Next, the first glass ceramic green sheets and second glass ceramic green sheets on which a conductive paste for forming an inner electrode had been printed were laminated in a predetermined order, and pressure-bonded. Subsequently, the resulting laminate was fired, thereby co-sintering the first glass ceramic composition and the second glass ceramic composition. Accordingly, monolithic capacitors used as samples including a co-sintered body including the first glass ceramic layers and the second glass ceramic layers were obtained. The monolithic capacitors used as the samples had a structure in which measuring terminals (outer electrodes) were provided such that electrical characteristics could be separately measured at the first ceramic layer side and the second ceramic layer side.

evaluated by substantially the same method as that used in Experimental Example 1. Furthermore, the rate of change in capacitance was evaluated by substantially the same method as that used in Experimental Example 3. The rate of change in capacitance was evaluated in only samples in which defects were not observed in the cross section of the co-sintered body.

Among the samples shown in Table 9, in Samples 501, 504, and 508 to 516, satisfactory results were obtained in terms of the defects on the cross section, the insulation reliability, and the rate of change in capacitance. In Samples 501, 504, and 508 to 516, Samples 102, 112, 115, 119, 122, 127, 131, 135, 137, and 140, which are the "first glass ceramic composition" used therein, are within the scope of preferred embodiments of the present invention, and Samples 401, 403, and 406 to 414, which are the "second glass ceramic composition" are within the scope of preferred embodiments of the present invention.

On the other hand, in Samples 502 and 507, samples 104 and 120, which are the "first glass ceramic composition" used therein, respectively, are outside of the scope of preferred embodiments of the present invention. In Samples 503, 505, and 506, Samples 402, 404, and 405, which are the "second glass ceramic composition" used therein, respectively, are outside the scope of preferred embodiments of the present invention. Accordingly, defects were generated in the cross section, and the insulation reliability was poor.

Sample 120, which was used as the "first glass ceramic composition", had satisfactory insulation reliability when used alone, as shown in Table 3. However, in Sample 507, in which Sample 120 was combined with the "second glass ceramic composition", the insulation reliability was poor as described above. In addition, Sample 402, which was used as the "second glass ceramic composition", had satisfactory insulation reliability when used alone, as shown in Table 8. However, in Sample 503, in which Sample 402 was combined with the "first glass ceramic composition", the insulation reliability was poor as described above. The reason for these

TABLE 9

| Sample No. | Sample number in Table 3 or 4 of first glass ceramic composition | Sample number in Table 8 of second glass ceramic composition | Defects on cross section of co-sintered body | Insulation reliability — First glass ceramic layer side | Insulation reliability — Second glass ceramic layer side | Rate of change in capacitance (%) — First glass ceramic layer side | Rate of change in capacitance (%) — Second glass ceramic layer side |
|---|---|---|---|---|---|---|---|
| 501 | 102 | 401 | Not observed | ○ | ○ | 0.06 | 0.22 |
| 502 | 104 | 401 | Observed | X | X | — | — |
| 503 | 106 | 402 | Observed | X | X | — | — |
| 504 | 112 | 403 | Not observed | ○ | ○ | 0.07 | 0.25 |
| 505 | 116 | 404 | Observed | X | X | — | — |
| 506 | 119 | 405 | Observed | X | X | — | — |
| 507 | 120 | 406 | Observed | X | X | — | — |
| 508 | 127 | 406 | Not observed | ○ | ○ | 0.07 | 0.23 |
| 509 | 137 | 407 | Not observed | ○ | ○ | 0.03 | 0.19 |
| 510 | 140 | 408 | Not observed | ○ | ○ | 0.04 | 0.15 |
| 511 | 102 | 409 | Not observed | ○ | ○ | 0.05 | 0.21 |
| 512 | 115 | 410 | Not observed | ○ | ○ | 0.14 | 0.17 |
| 513 | 119 | 411 | Not observed | ○ | ○ | 0.08 | 0.13 |
| 514 | 122 | 412 | Not observed | ○ | ○ | 0.03 | 0.24 |
| 515 | 131 | 413 | Not observed | ○ | ○ | 0.14 | 0.17 |
| 516 | 135 | 414 | Not observed | ○ | ○ | 0.06 | 0.16 |

Next, as shown in Table 9, for each of the samples, a cross section of the co-sintered body was observed to evaluate the presence or absence of defects (i.e., pores) in the cross section. For each of the first glass ceramic layer side and the second glass ceramic layer side, insulation reliability was results is believed to be as follows. When one or both the "first glass ceramic composition" and the "second glass ceramic composition" include a L1 component or a B component in an excessive amount or include Al, interdiffusion readily occurs between the two materials during sintering, and a reaction occurs in both materials, thereby generating pores. As a result, the insulating property decreases in both of the materials.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A monolithic ceramic electronic component comprising a first glass ceramic layer produced by firing a glass ceramic composition comprising a $SrZrO_3$ ceramic;
   a $Li_2O$—$MgO$—$ZnO$—$B_2O_3$—$SiO_2$-based glass; and
   $Mg_2SiO_4$ in an amount of about 5 to 40 weight percent, wherein
   the $Li_2O$—$MgO$—$ZnO$—$B_2O_3$—$SiO_2$-based glass accounts for about 1 to about 12 weight percent of the total and includes $Li_2O$ in an amount in the range of about 3.5 to about 15 weight percent, MgO in an amount in the range of about 20 to about 50 weight percent, BaO in an amount in the range of about 0 to about 25 weight percent, CaO in an amount in the range of about 0 to about 10 weight percent, SrO in an amount in the range of about 0 to about 25 weight percent, $B_2O_3$ in an amount in the range of about 16 to about 29 weight percent, $SiO_2$ in an amount in the range of about 11 to about 35 weight percent, ZnO in an amount in the range of about 5 to about 20 weight percent, and $Al_2O_3$ in an amount in the range of about 0 to about 15 weight percent; and
   the glass ceramic composition further comprises a $SrTiO_3$ ceramic in an amount in the range of about 0 to about 6 weight percent of the total, and further comprising:
   a second glass ceramic layer laminated with the first glass ceramic layer; wherein
   the second glass ceramic layer is defined by a fired second glass ceramic composition comprising:
   a first ceramic powder including forsterite as a main component;
   a second ceramic powder including at least one selected from the group consisting of a ceramic powder including calcium titanate as a main component, a ceramic powder including strontium titanate as a main component, and a ceramic powder including titanium oxide as a main component; and
   a borosilicate glass powder including lithium in an amount in the range of about 3 to about 15 weight percent in the form of $Li_2O$, magnesium in an amount in the range of about 20 to about 50 weight percent in the form of MgO, boron in an amount in the range of about 15 to about 30 weight percent in the form of $B_2O_3$, silicon in an amount in the range of about 10 to about 45 weight percent in the form of $SiO_2$, zinc in an amount in the range of about 6 to about 20 weight percent in the form of ZnO, and aluminum in an amount in the range of about 0 to about 15 weight percent in the form of $Al_2O_3$, the borosilicate glass powder accounts for at least about 3 weight percent of the second glass ceramic composition; and at least one type of additive component selected from the group consisting of calcium oxide, barium oxide, and strontium oxide is added to the borosilicate glass powder; wherein when the content of the additive component is represented by the ratio of the additive component to the borosilicate glass powder, a lower limit of the content of the additive component is about 2 weight percent in total where calcium oxide, barium oxide, and strontium oxide are in the form of CaO, BaO, and SrO, respectively, and an upper limit of the content of the additive component is about 15 weight percent in the form of CaO where calcium oxide is added, about 25 weight percent in the form of BaO where barium oxide is added, and about 25 weight percent in the form of SrO where strontium oxide is added.

2. The monolithic ceramic electronic component according to claim 1, further comprising conductor patterns including at least one of gold, silver, or copper as a main component, wherein the conductor patterns are formed on a surface of and/or inside the monolithic ceramic electronic component by simultaneous firing with the glass ceramic composition.

3. The monolithic ceramic electronic component according to claim 1, further comprising a $BaZrO_3$ ceramic in an amount in the range of about 1 to about 84 weight percent.

4. The monolithic ceramic electronic component according to claim 3, wherein the content of the $BaZrO_3$ ceramic is in the range of about 1 to about 30 weight percent.

5. The monolithic ceramic electronic component according to claim 1, further comprising $TiO_2$ in an amount in the range of about 3 to about 10 weight percent.

6. The monolithic ceramic electronic component according to claim 1, further comprising $ZrO_2$ in an amount of about 6 weight percent or less.

* * * * *